(12) United States Patent
Lin et al.

(10) Patent No.: US 7,495,304 B2
(45) Date of Patent: Feb. 24, 2009

(54) CHIP PACKAGE

(75) Inventors: Mou-Shiung Lin, Hsin-Chu (TW);
Shih-Hsiung Lin, Hsin-Chu (TW);
Hsin-Jung Lo, Yonghe (TW)

(73) Assignee: MEGICA Corporation, Hsinchu (TW)

( * ) Notice: Subject to any disclaimer, the term of this patent is extended or adjusted under 35 U.S.C. 154(b) by 149 days.

(21) Appl. No.: 11/422,337

(22) Filed: Jun. 6, 2006

(65) Prior Publication Data

US 2006/0273435 A1     Dec. 7, 2006

(30) Foreign Application Priority Data

Jun. 6, 2005     (TW) .............................. 94118540 A

(51) Int. Cl.
*H01L 23/02* (2006.01)

(52) U.S. Cl. ........................................ 257/432; 257/680

(58) Field of Classification Search ......... 257/432–436, 257/680, E23.009, E23.01, E23.011; 438/69, 438/70, 116, 121
See application file for complete search history.

(56) References Cited

U.S. PATENT DOCUMENTS

| | | | |
|---|---|---|---|
| 6,744,109 B2 * | 6/2004 | Barton et al. | 257/436 |
| 6,872,984 B1 * | 3/2005 | Leung | 257/81 |
| 7,122,874 B2 * | 10/2006 | Kim | 257/433 |

* cited by examiner

*Primary Examiner*—Zandra Smith
*Assistant Examiner*—Paul E Patton
(74) *Attorney, Agent, or Firm*—Winston Hsu

(57) ABSTRACT

A chip package includes a bump connecting said semiconductor chip and said circuitry component, wherein the semiconductor chip has a photosensitive area used to sense light. The chip package may include a ring-shaped protrusion connecting a transparent substrate and the semiconductor chip.

20 Claims, 20 Drawing Sheets

CHIP PACKAGE

FIELD OF THE INVENTION

The invention relates to a chip package and a process for fabricating the same, and more particularly to a photo-sensitive chip package and a process for fabricating the same.

DESCRIPTION OF THE PRIOR ART

In the recent years, the electronic technology is advanced with each passing day and more new high-tech electronic products are presented to the public as well with more humanity, more convenience in the functions. However, all those products come into a trend toward lighter, thinner, and handier in order to provide more convenient and comfortable usage. Electronic packaging plays an important role in the fulfillment in communication industry and digital technology. Electronic consumer products such as PDA, Pocket PC, Portable PC and mobile phone accompanied with the digital image products such as digital camera and digital video cameras have become a trend.

The key component that makes a digital camera and a digital video camera capable of sensing images is a photo-sensitive device. The photo-sensitive device is able to sense the intensity of light and transfer electrical signals based on the light intensity for further processing. Furthermore, the packaging process is necessary to make the photo-sensitive chip connectable to outer electrical circuit through the substrate and protect the photo-sensitive chip from impurity and moisture contacting the sensitive area.

FIG. 1A is schematically cross-sectional view of a conventional chip package. Referring to FIG. 1A, a chip package 101 comprises a semiconductor chip 110, a circuitry board 120, a transparent substrate 130 and an adhesive material 140. The semiconductor chip 110 is formed by cutting and separating a wafer (not shown). The semiconductor chip 110 has a photo-sensitive area 112, multiple electronic components 114 and multiple connecting points. The photo-sensitive area 112 and the connecting points 116 are located on an active surface 110a of the semiconductor chip 110. The connecting points 116 are distributed around the photo-sensitive area 112. The electronic components 114, such as MOS devices or transistors, are allocated inside the semiconductor chip 110. In the photo-sensitive area 112 are an optical filter 12 and multiple micro-lenses 14 to filter and concentrate the light from the outside, respectively. The electronic components 114 in the photo-sensitive area 112 can sense the intensity of the light filtered and concentrated by the optical filter 12 and the micro-lenses 14 to generate electrical signals corresponding with the intensity of the light.

Referring to FIG. 1A, the semiconductor chip 110 is mounted on the circuitry board 120. The circuitry board 120 may comprises a hard core insulating layer, multiple polymer layers and multiple patterned metal layers. The polymer layers and patterned metal layers are formed on the top and bottom sides of the hard core insulating layer. The hard core insulating layer, such as FR-4 or FR-5, may comprise polymer and glass. The circuitry board 120 may includes multiple connecting points 122 on a top surface thereof and surrounding an area used to be joined with the semiconductor chip 110. After joining the semiconductor chip 110 and the circuitry board 120, multiple wires are formed by a wirebonding process to connect the connecting points 116 of the semiconductor chip 110 to the connecting points 122 of the circuitry board 120.

Referring to FIG. 1A, after the semiconductor chip 110 is mounted on the circuitry board 120 and multiple wires 10 are formed by a wirebonding process to connect the connecting points 116 of the semiconductor chip 110 to the connecting points 122 of the circuitry board 120, one of the transparent substrates 130 divided from a large plane piece of transparent material (not shown) is joined to the circuitry board 120 using the adhesive material 140. The material of the transparent substrate 130 is glass. The adhesive material 140 is epoxy resin. The adhesive material 140 surrounds the semiconductor chip 110 and the wires 10. The circuitry board 120, transparent substrate 130 and adhesive material 140 construct an airtight space 150 accommodating the semiconductor chip 110. Next, multiple solder balls 18 are formed on the bottom surface of the circuitry board 120 to form an electrical connection from the circuitry board 120 to a next-level printed circuit board (PCB, not shown). Thereafter, cutting the circuitry board 120 is performed and then multiple individual chip packages are completed.

FIG. 1B is a schematically cross-sectional view of another conventional chip package. Referring to FIG. 1B, the chip package 201 comprises of a semiconductor chip 201, a flexible circuitry substrate 220, multiple bumps 230, a transparent substrate 240, an adhesive material 250 and an underfill 260. The semiconductor chip 210 has a photo-sensing function and the detail structure of the semiconductor chip 210 can refer to the structure of the above-mentioned semiconductor chip 110 in FIG. 1A.

Referring to FIG. 1B, the bumps 230 are formed on multiple connecting points 216 of the semiconductor chip 210. Next, the semiconductor chip 210 is bonded to a metal layer 220a of the flexible circuitry substrate 220 through the bumps 230. The flexible circuitry substrate 220 further comprises an insulating polymer layer 220b joined to the metal layer 220a. Thereafter, the underfill 260 is provided to fill the space between the semiconductor chip 210 and the flexible circuitry substrate 220 and to cover the bumps 230. One of the transparent substrates 130 divided from a large plane piece of transparent material (not shown) is joined to the flexible circuitry substrate 120 using the adhesive material 250, wherein the transparent substrates 240 are glass, for example. At this time, the semiconductor chip 210, transparent substrate 240, flexible circuitry substrate 220, bumps 230 and underfill 260 construct an airtight space 270. Thereafter, the flexible circuitry substrate 220 is cut to form multiple individual chip packages 201.

It is worthy to notice that the fabrication of the package structures 101 and 201 as above-mentioned in FIGS. 1A and 1B is performed to attach the transparent substrate 130 or 240 onto the semiconductor chip 110 or 210 in a packaging fab. Therefore, the photo-sensitive areas of the semiconductor chips 110 and 210 will be exposed in a clean room in the packaging fab. Because the class of the clean room in the packaging fab is typically 100-100, many tiny dust particles in the air will fall on the photo-sensitive areas 112 and 212 of the chips 110 and 210. This affects their sensitivity.

Besides, in the prior art, such a process that the transparent substrate 130 or 240 after cut is joined piece by piece to the semiconductor chip 110 or 210 is joined to the transparent substrate 130 or 240 through the adhesive material 140 or 250 is not efficient.

SUMMARY OF THE INVENTION

Therefore, one objective of the present invention is to provide a chip package having an improved yield.

In order to reach the above objectives, the present invention provides a chip package including a bump connecting said semiconductor chip and said circuitry component, wherein the semiconductor chip has a photosensitive area used to sense light. The chip package may include a ring-shaped protrusion connecting a transparent substrate and the semiconductor chip.

Both the foregoing general description and the following detailed description are exemplary and explanatory only and are not restrictive to the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated as a part of this specification. The drawings illustrate embodiments of the invention and, together with the description, serve to explain the principles of the invention.

FIGS. 3AA and 3AB are schematically cross-sectional views showing a process for forming a ring-shaped protrusion 416 and bump 418.

FIG. 3AC is a schematically top view showing the arrangement of the ring-shaped protrusion 416 and bumps 418.

FIGS. 5BA-5BC are schematically cross-sectional views showing a process for forming a ring-shaped protrusion 917 and bump 916.

FIGS. 5BD-5BF are schematically cross-sectional views showing a process for forming a ring-shaped protrusion 1016 and bump 1017.

FIGS. 6BA-6BB are schematically cross-sectional views showing a process for forming multiple ring-shaped protrusions on a transparent substrate according to the third embodiment of this invention.

DESCRIPTION OF THE PREFERRED EMBODIMENTS

First Embodiment

Figure 1A:
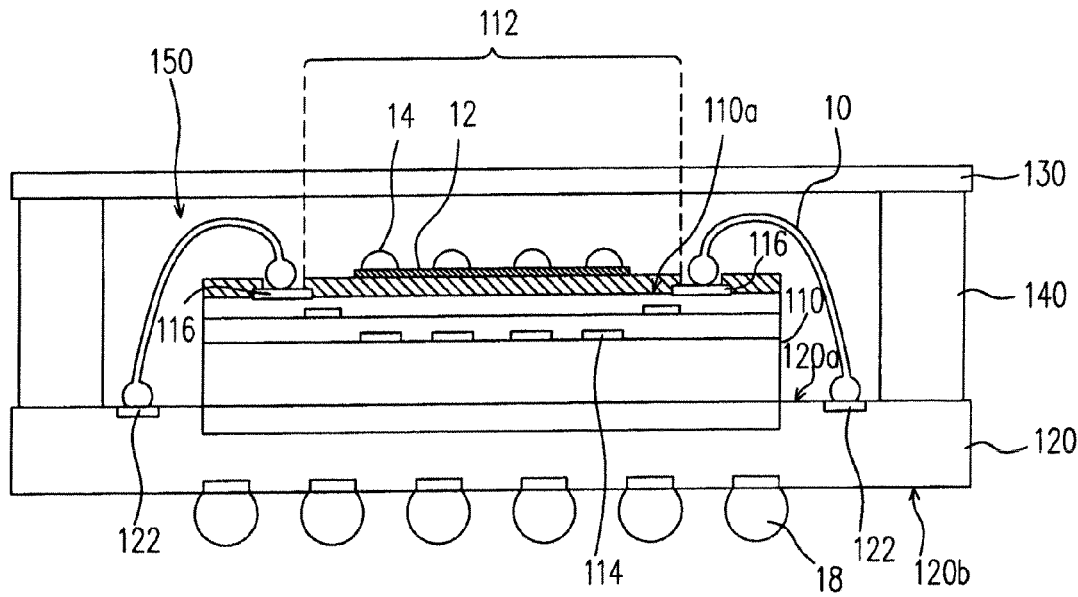
FIG. 1A is schematically cross-sectional view of a conventional chip package.
Figure 1B:
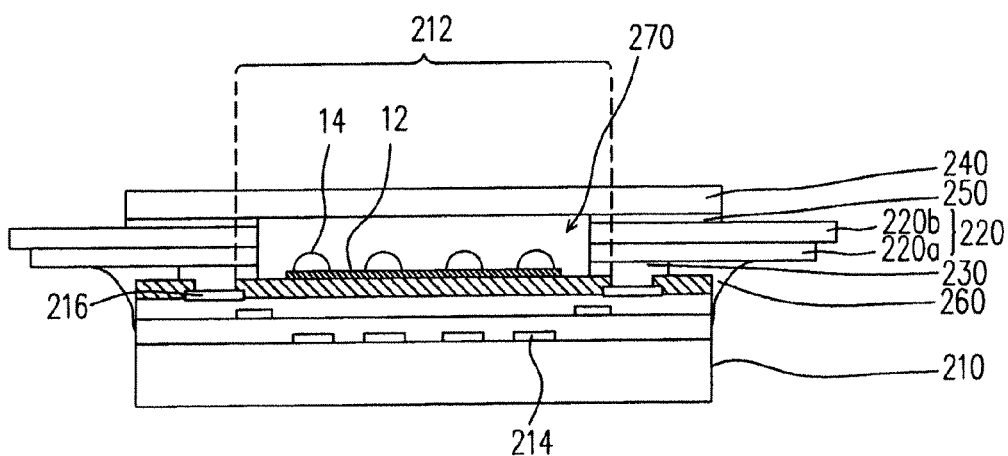
FIG. 1B is a schematically cross-sectional view of another conventional chip package.
Figure 2A:
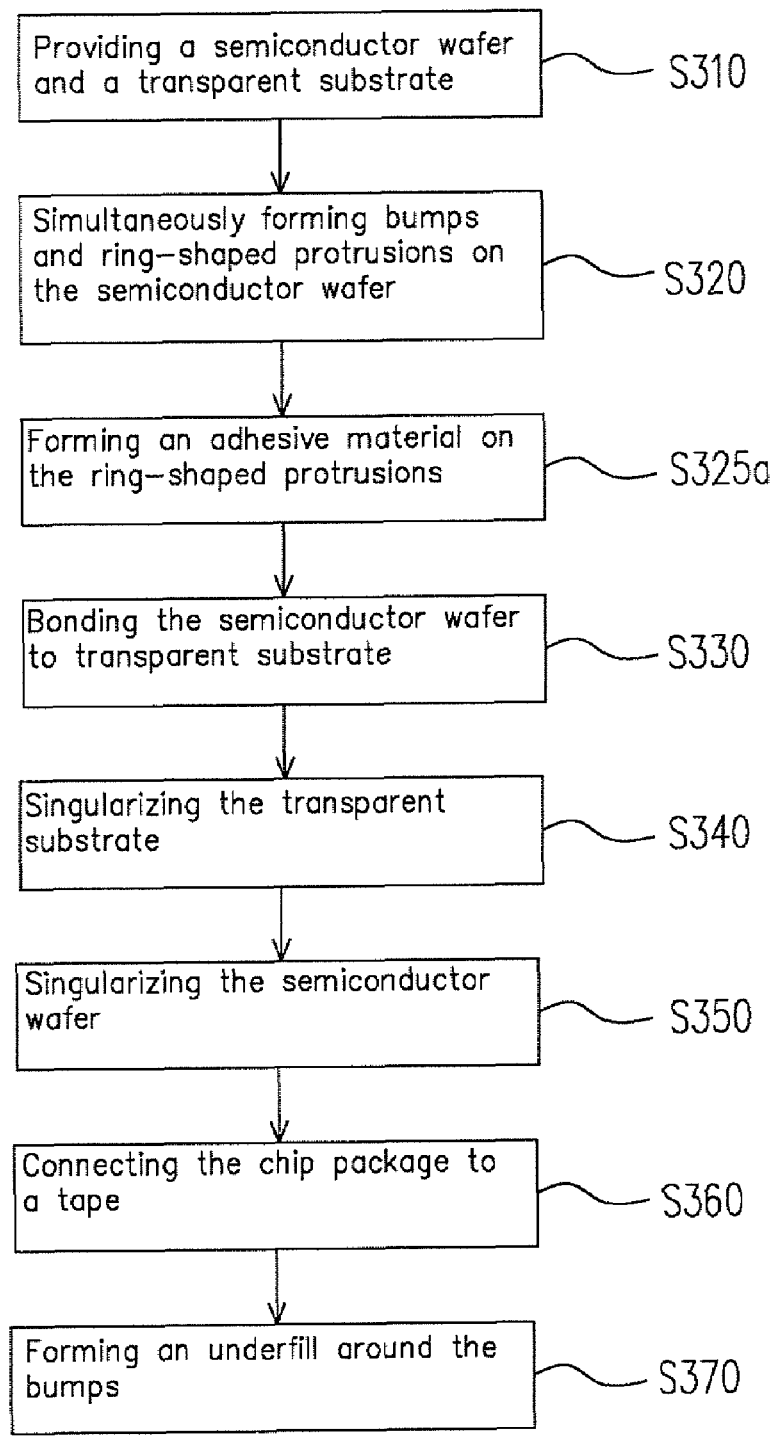
FIG. 2A is a flowchart of fabricating a chip package according to the first embodiment of this invention.
Figure 3A:
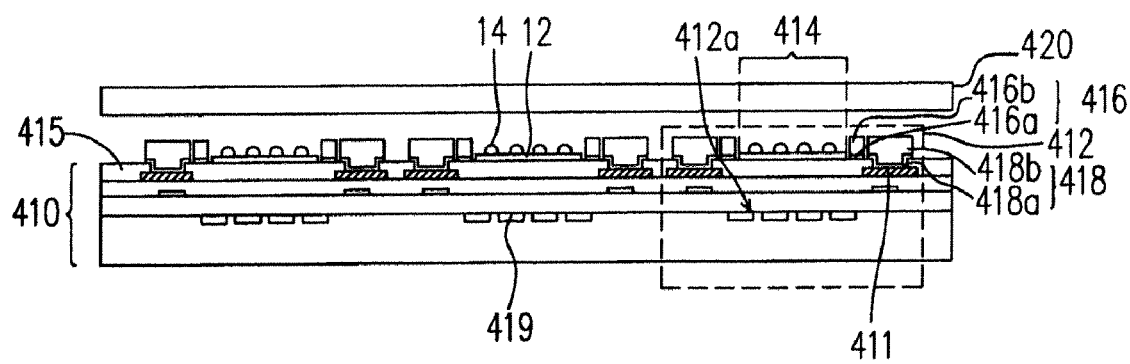
FIG. 3A is a schematically cross-sectional view including a wafer and a transparent substrate before being joined together according to the first embodiment of this invention.

FIG. 2A is a flowchart of fabricating a chip package according to the first embodiment of this invention. FIG. 3A is a schematically cross-sectional view including a wafer and a transparent substrate before being joined together according to the first embodiment of this invention. Referring to FIGS. 2A and 3A, the process S300a for fabricating a semiconductor chip package comprises several steps as follows. First, in step S310, a semiconductor wafer 410 and a transparent substrate 420 are provided. The semiconductor wafer 410 comprises multiple semiconductor chips 412 each having a photosensitive area 414 on an active surface 412a of the semiconductor chip 412 to sense the external light. The material of the transparent substrate 420 contains, for example, glass. There are an optical filter 12 and multiple micro-lenses 14 on the photo-sensitive area 414 where the external light can be focused and filtered. The intensity of the light illuminating on the photo-sensitive area 414 can be sensed by semiconductor devices 419 to generate electrical signals corresponding to the light intensity. The semiconductor devices 419 may be CMOS light sensors, photo-sensitive P/N junctions or charge coupled devices (CCD), which is connected to sense amplifier, CMOS circuits or other integrated circuits.

Next, in step S320, multiple ring-shaped protrusions 416 and bumps 418 are formed over the active surface 412a of the semiconductor wafer 410 simultaneously. The protrusions 416 from a top view are ring shaped. In the semiconductor chip 412, the ring-shaped protrusion 416 surrounds the photosensitive area 414 and the bumps 418 surround the ring-shaped protrusion 416. The ring-shaped protrusions 416 and bumps 418 contain an adhesion/barrier layer 416a or 418a and a gold layer 416b or 418b, for example. For the ring-shaped protrusions 416, the adhesion/barrier layer 416a is formed on a topmost insulating layer 415 of the semiconductor wafer 410, and the gold layer 416b is formed on the adhesion/barrier layer 416a. For the bumps 418, the adhesion/barrier layer 418a is formed on contact pads exposed by openings in a topmost insulating layer 415 of the semiconductor wafer 410, and the gold layer 416b is formed on the adhesion/barrier layer 416a. The material of the adhesion/barrier layer 416a or 418a contains, for example, Ti—W alloy, titanium nitride or tantalum nitride, etc. The topmost insulating layer 415 may be a passivation layer. Multiple openings in the passivation layer 415 expose multiple bonding pads. The bonding pads 411 may contain more than 90 weight percent of aluminum. The bonding pads 411 may be aluminum-copper alloy having a thickness of between 0.1 and 1 microns, formed by a sputtering process. Alternatively, the bonding pads 411 may include a copper layer having a thickness of between 0.1 and 1 micron, formed by a sputtering, electroplating or CVD process, and an adhesion/barrier layer covering the sidewalls and the bottom of the copper layer, wherein the adhesion/barrier layer, such as tantalum nitride, tantalum, titanium nitride or titanium, may have a thickness of between 500 and 3000 angstroms.

In a first case, the passivation layer 415 can be formed by first depositing a silicon-oxide layer with a thickness of between 0.2 and 0.7 microns using a PECVD process, then depositing a silicon-nitride layer with a thickness of between 0.2 and 0.7 microns on the silicon-oxide layer using a PECVD process.

In another case, the passivation layer 415 can be formed by first depositing a silicon-oxide layer with a thickness of between 0.2 and 0.7 microns using a PECVD process, then depositing a silicon-oxynitride layer with a thickness of between 0.05 and 0.15 microns on the silicon-oxide layer using a PECVD process, and then depositing a silicon-nitride layer with a thickness of between 0.2 and 0.7 microns on the silicon-oxynitride layer using a PECVD process.

In another case, the passivation layer 415 can be formed by first depositing a silicon-oxynitride layer with a thickness of between 0.05 and 0.15 microns using a PECVD process, then depositing a silicon-oxide layer with a thickness of between 0.2 and 0.7 microns on the silicon-oxynitride layer using a PECVD process, and then depositing a silicon-nitride layer with a thickness of between 0.2 and 0.7 microns on the silicon-oxide layer using a PECVD process.

In another case, the passivation layer 415 can be formed by first depositing a silicon-oxide layer with a thickness of between 0.2 and 0.5 microns using a PECVD process, then depositing a silicon-oxide layer with a thickness of between 0.5 and 1 microns on the PECVD silicon-oxide layer using a spin-coating process, then depositing a silicon-oxide layer with a thickness of between 0.2 and 0.5 microns on the spin-coated silicon-oxide layer using a PECVD process, and then depositing a silicon-nitride layer with a thickness of between 0.2 and 0.7 microns on the PECVD silicon-oxide layer using a PECVD process.

In another case, the passivation layer 415 can be formed by first depositing a silicon-oxide layer with a thickness of between 0.5 and 2 microns using a HDP-CVD process, and then depositing a silicon-nitride layer with a thickness of between 0.2 and 0.7 microns on the silicon-oxide layer using a PECVD process.

In another case, the passivation layer 415 can be formed by first depositing a USG layer with a thickness of between 0.2 and 3 microns, then depositing a layer of TEOS, BPSG or PSG with a thickness of between 0.5 and 3 microns on the USG layer, and then depositing a silicon-nitride layer with a thickness of between 0.2 and 0.7 microns on the layer of TEOS, BPSG or PSG using a PECVD process.

In another case, the passivation layer 415 can be formed by optionally first depositing a first silicon-oxynitride layer with a thickness of between 0.05 and 0.15 microns using a PECVD process, then depositing a silicon-oxide layer with a thickness of between 0.2 and 0.7 microns optionally on the first silicon-oxynitride layer using a PECVD process, then optionally depositing a second silicon-oxynitride layer with a thickness of between 0.05 and 0.15 microns on the silicon-oxide layer using a PECVD process, then depositing a silicon-nitride layer with a thickness of between 0.2 and 0.7 microns on the second silicon-oxynitride layer or on the silicon-oxide layer using a PECVD process, then optionally depositing a third silicon-oxynitride layer with a thickness of between 0.05 and 0.15 microns on the silicon-nitride layer using a PECVD process, and then depositing a silicon-oxide layer with a thickness of between 0.2 and 0.7 microns on the third silicon-oxynitride layer or on the silicon-nitride layer using a PECVD process.

In another case, the passivation layer 415 can be formed by first depositing a first silicon-oxide layer with a thickness of between 0.2 and 0.7 microns using a PECVD process, then depositing a second silicon-oxide layer with a thickness of between 0.5 and 1 microns on the first silicon-oxide layer using a spin-coating process, then depositing a third silicon-oxide layer with a thickness of between 0.2 and 0.7 microns on the second silicon-oxide layer using a PECVD process, then depositing a silicon-nitride layer with a thickness of between 0.2 and 0.7 microns on the third silicon-oxide layer using a PECVD process, and then depositing a fourth silicon-oxide layer with a thickness of between 0.2 and 0.7 microns on the silicon-nitride layer using a PECVD process.

In another case, the passivation layer 415 can be formed by first depositing a silicon-oxide layer with a thickness of between 0.5 and 2 microns using a HDP-CVD process, then depositing a silicon-nitride layer with a thickness of between 0.2 and 0.7 microns on the silicon-oxide layer using a PECVD process, and then depositing another silicon-oxide layer with a thickness of between 0.5 and 2 microns on the silicon-nitride layer using a HDP-CVD process.

FIGS. 3AA and 3AB are schematically cross-sectional views showing a process for forming a ring-shaped protrusion 416 and bump 418. Referring FIGS. 3AA and 3AB, the ring-shaped protrusions 416 and bumps 418 can be formed by first sputtering an adhesion/barrier layer 810, such as titanium, a titanium-tungsten alloy, chromium, titanium-nitride, tantalum, tantalum-nitride, with a thickness of between 100 and 5000 angstroms, for example, on the passivation layer 415 and the bonding pad 411 exposed by the opening 415a in the passivation layer 415, then sputtering, electroless plating or electroplating a seed layer 812, such as gold or copper, with a thickness of between 1000 angstroms and 2 microns, for example, on the adhesion/barrier layer 810, next forming a photoresist layer 814 on the seed layer 812, multiple bump-shaped openings 814a and ring-shaped openings 815a (from a top view) in the photoresist layer 814 exposing the seed layer 812, then electroplating a bulk metal layer having multiple bump-shaped structure 816 and multiple loop-shaped structure 817 (from a top view), on the seed layer 812 exposed by the openings 814a and 814b in the photoresist layer 814, then removing the photoresist layer 814, then etching the seed layer 812 not under the bulk metal layer 816 and 817, and then etching the adhesion/barrier layer 810 not under the bulk metal layer 816 and 817. The bulk metal layer 816 and 817 may contain more than 95 weight percent of gold and may have a thickness of between 1 and 50 microns; in this case, the seed layer 812 is preferably gold. Alternatively, the bulk metal layer 816 and 817 may be formed by first electroplating a copper layer on the seed layer 812 exposed by the openings 815a and 815b in the photoresist layer 814, next electroplating a nickel layer on the copper layer in the openings 815a and 815b in the photoresist layer 814, and then electroplating a solder layer on the nickel layer in the openings 815a and 815b in the photoresist layer 814. The copper layer contains more than 95 weight percent of copper and has a thickness of between 1 and 100 microns, and preferably between 50 and 100 microns; in this case, the seed layer 812 is preferably copper. The nickel layer contains more than 95 weight percent of nickel and has a thickness of between 1 and 100 microns, and preferably between 1 and 10 microns. The solder layer contains a tin-lead alloy, a tin-silver alloy or a tin-silver-copper alloy, and has a thickness of between 1 and 300 microns, and preferably between 10 and 50 microns.

FIG. 3AC is a schematically top view showing the arrangement of the ring-shaped protrusion 416 and bumps 418. Referring FIG. 3AC, the bumps 418 surround the ring-shaped protrusion 416. Each ring-shaped protrusion 416 may have four sides and an opening or gap 413 may be formed at the middle part of one or more of the four sides. The opening or gap 413 may have a least lateral transverse dimension d of between 5 and 100 microns, and preferably between 5 and 50 microns.

Figure 3B:
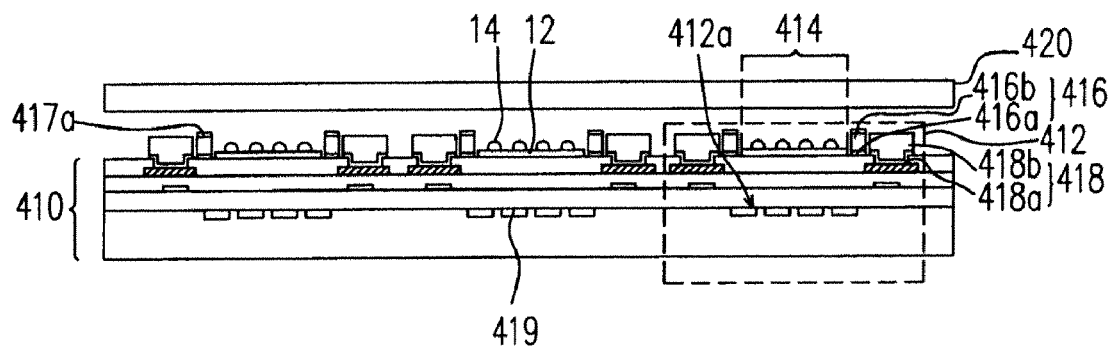
FIGS. 3B, 3B', and 3C-3H are schematically cross-sectional views showing a process for fabricating a semiconductor chip package according to the first embodiment of this invention.
Figure 3A:
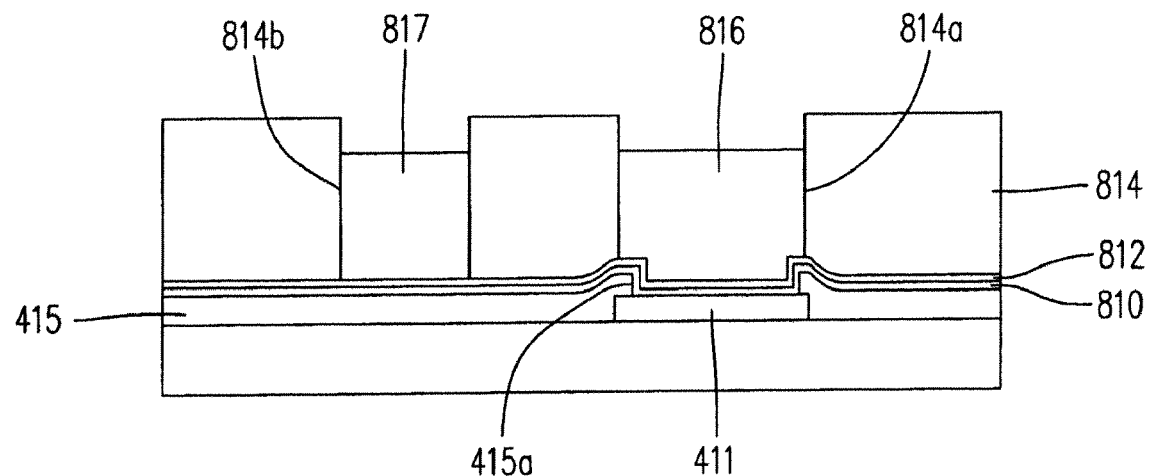
Figure 3A:
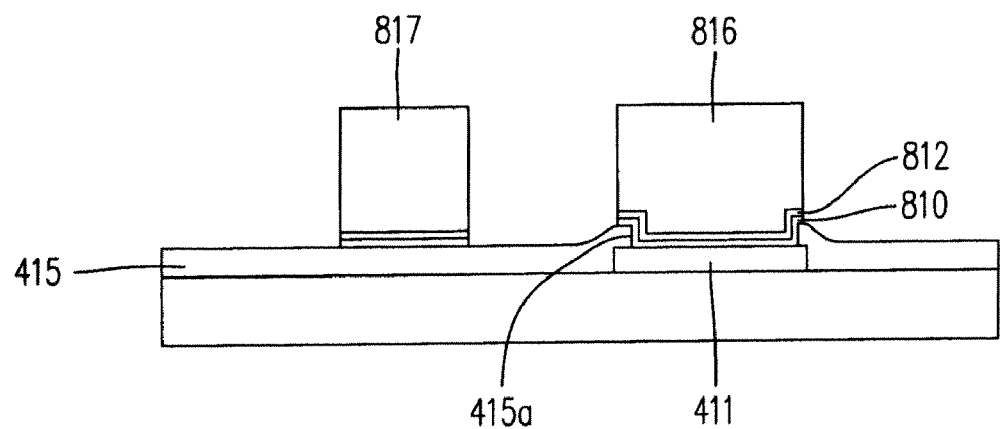
Figure 3A:
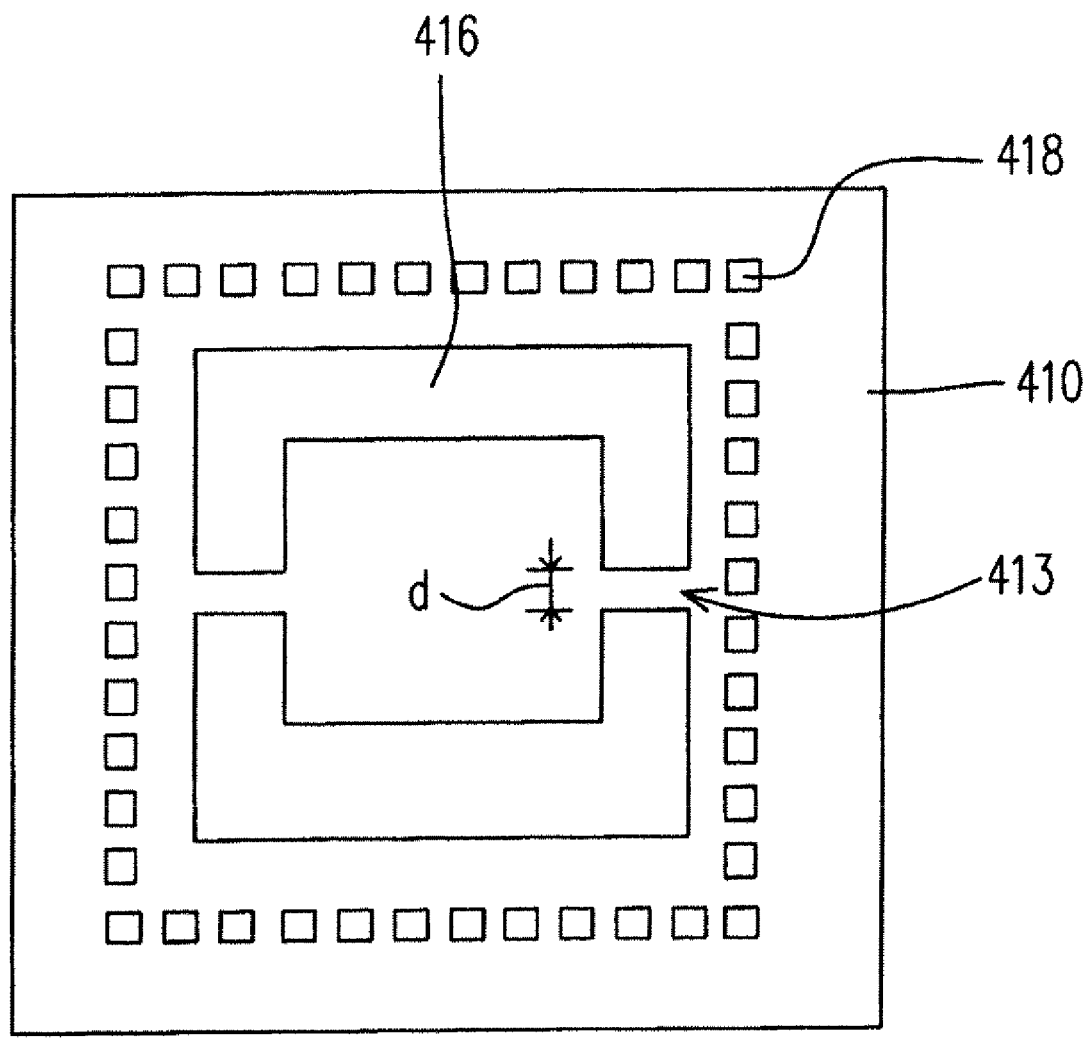
Figure 3B:
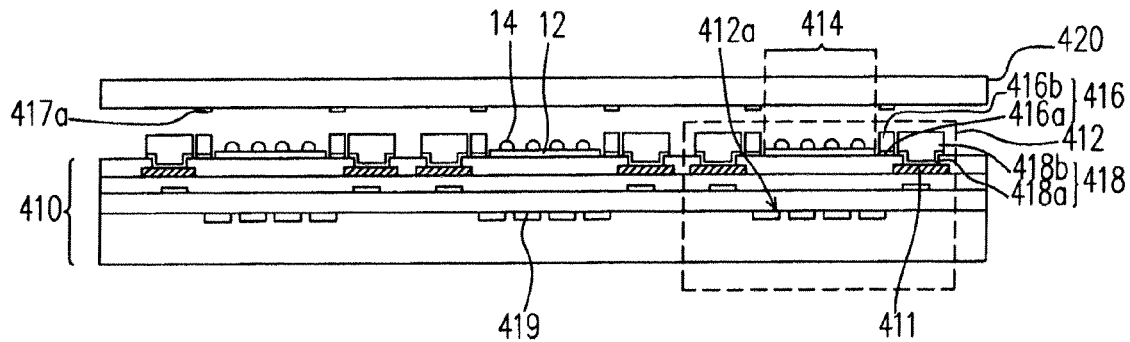

FIG. 3B is a schematically cross-sectional view showing a process of fabricating a semiconductor chip according to the first embodiment of this invention. Referring to FIGS. 2A and 3B, in step S325a, an adhesive material 417a with a ring-shaped pattern is deposited on the ring-shaped protrusion 416, wherein the adhesive material 417a is, for example, a solder paste, an epoxy resin, polyimide, benzocyclobutene (BCB), or a material used as a solder mask layer of a printed circuit board and can be formed by screen printing. Alternatively, the top surface of the ring-shaped protrusion 416 can be dipped in an adhesive material to have the adhesive material 417a formed thereon. Preferably, the height of the adhesive material 417a plus the ring-shaped protrusions 416 is higher than the height of the bumps 418.

Alternatively, the adhesive material 417a may comprise solder, such as tin-lead alloy or tin-silver alloy. In this case, the adhesive material 417a can be formed by screen printing a solder paste mixed with flux on the ring-shaped protrusion 416. Alternatively, an adhesion layer with a ring-shaped pattern, such as chromium, titanium, copper, gold or nickel, having a thickness of between 3000 angstroms and 5 microns may be formed on all bottom surface of the transparent substrate 420 by sputtering or evaporating; then, patterning the adhesion layer using a photolithography and etching process to be formed with a ring shape (from a top view). Next, the adhesive material 417a of solder is readily bonded onto the adhesion layer formed on the transparent substrate 420.

Figure 2B:
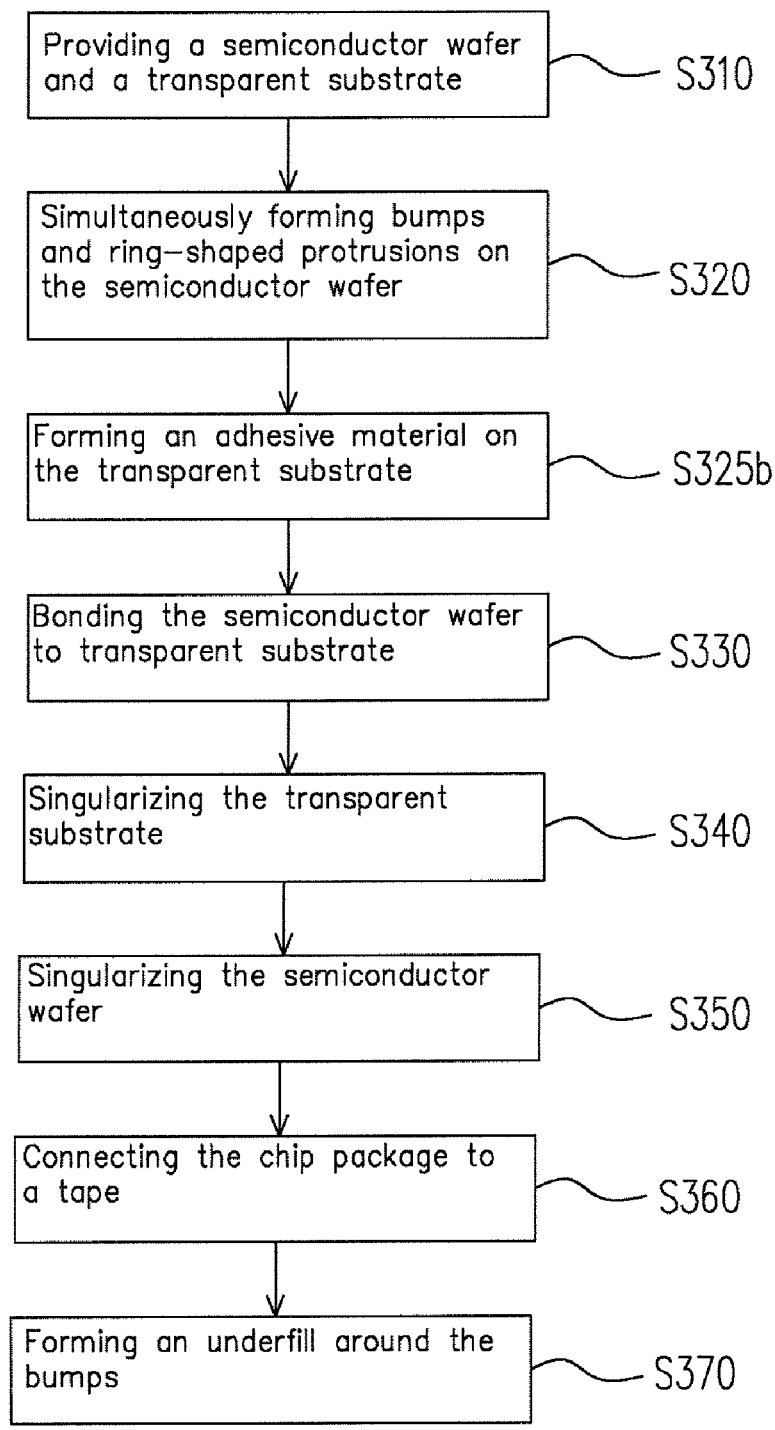
FIG. 2B is another flowchart of fabricating a chip package according to the first preferred embodiment of this invention.

FIG. 2B is another flowchart of fabricating a chip package according to the first preferred embodiment of this invention. FIG. 3B' is a schematically cross-sectional view of the chip package process according to the first embodiment of this invention. Referring to FIGS. 2A, 2B and 3B', the above-mentioned step S325a can be replaced by choosing to carry out the step 325b of a semiconductor chip package process S300b shown in FIG. 2B. An adhesive material 417b can be formed on the transparent substrate 420, wherein the height of the adhesive material 417b plus the ring-shaped protrusions 416 is higher than the height of the bumps 418. The transparent substrate 420 may be made of silicon oxide, glass or transparent plastic sheet, for example. The adhesive material 417b is, for example, an epoxy resin, polyimide, benzocyclobutene (BCB) or a material used as a solder mask layer of a printed circuit board.

Alternatively, the adhesive material 417b may comprise solder, such as tin-lead alloy or tin-silver alloy. In this case, the adhesive material 417b can be formed by first sputtering an adhesion layer (not shown), such as titanium, a titanium-tungsten alloy, chromium, copper or nickel, can be on the transparent substrate 420, then patterning the adhesion layer to be formed with a ring shape (from a top view) using a photolithography and etching processes, and then screen printing a solder paste with flux, having a ring shape, on the patterned adhesion layer. Using a reflow process, the ring-shaped solder paste may bond the ring-shaped protrusion 416 to the transparent substrate 420. Alternatively, the adhesive material 417b can be formed by first sputtering an adhesion layer (not shown), such as titanium, a titanium-tungsten alloy, chromium, copper or nickel, can be on the transparent substrate 420, then forming a photoresist layer on the adhesion layer, multiple ring-shaped openings in the photoresist layer exposing the adhesion layer, then electroplating a ring-shaped copper layer with a thickness of between 1 and 10 microns on the adhesion layer, next electroplating a ring-shaped nickel layer with a thickness of between 0.5 and 5 microns on the ring-shaped copper layer, next electroplating a ring-shaped solder layer, such as tin-lead alloy, tin-silver alloy or tin-silver-copper alloy, with a thickness of between 5 and 50 microns on the ring-shaped nickel layer, then removing the photoresist layer, and then removing the adhesion layer not under the solder layer. Using a reflow process, the ring-shaped solder paste may bond the ring-shaped protrusion 416 to the transparent substrate 420. The rest steps of the chip package process S300b are similar to those of the chip package process S300a.

Figure 3C:
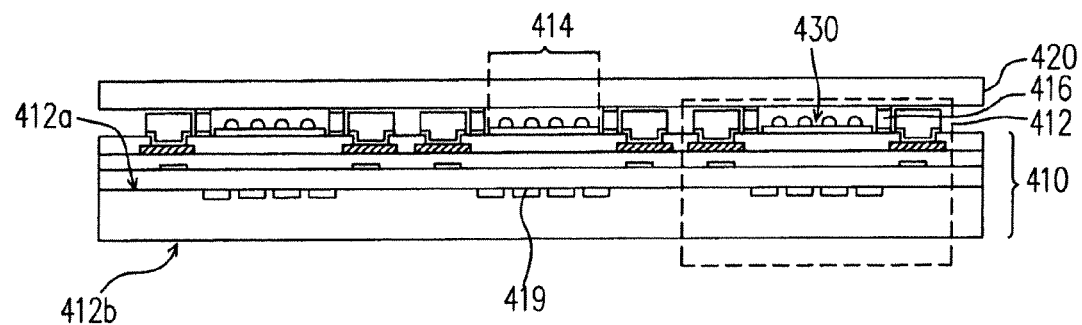

FIG. 3C is a schematically cross-sectional view showing a process of fabricating a chip package according to the first embodiment of this invention. In step S330, the transparent substrate 420 is joined to the wafer 410 through the adhesive material 417. The semiconductor chip 412, transparent substrate 420 and ring-shaped protrusions 416 may construct multiple cells 430. As shown in FIG. 3AC, the opening or gap 413 connects the cell 430 and the ambient space outside the cell 430. Alternatively, no opening or gap may be formed to connect the cell 430 and the ambient space outside the cell 430. Therefore, external particles falling onto the photo-sensitive area 414 may be avoided.

Figure 3D:
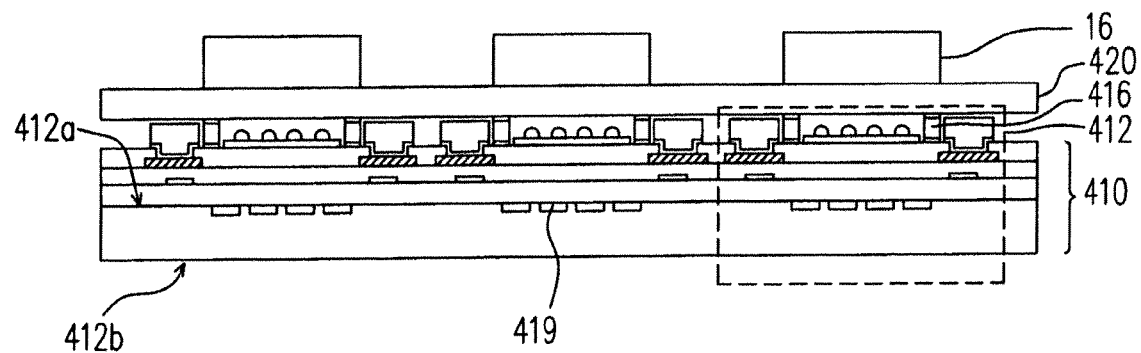
Figure 3E:
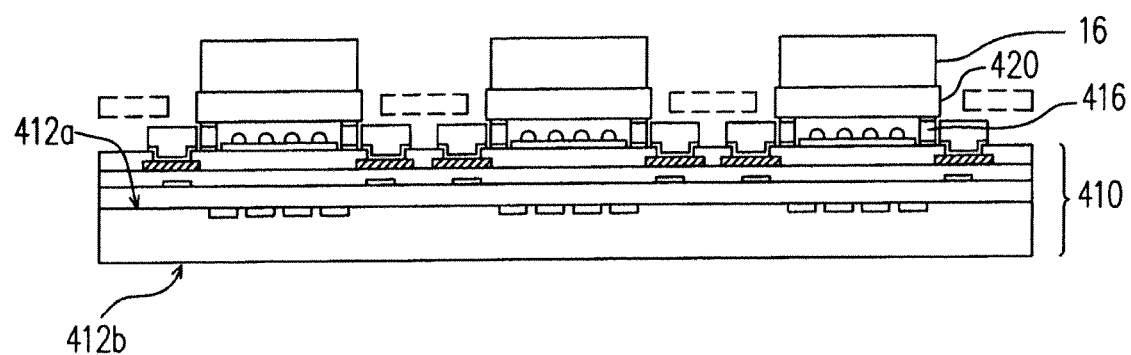

FIGS. 3D and 3E are schematically cross-sectional views showing a process of fabricating a chip package according to the first embodiment of this invention. Referring to FIGS. 2A, and 3D, in step S340, the transparent substrate 420 is patterned using photolithography and etching processes, depicted as follows. First, referring to FIG. 3D, a photoresist layer 16 is coated on the transparent substrate 420. Next, the pattern of the photoresist layer 16 is defined using a photolithography process. Referring to FIG. 3E, using the patterned photoresist layer 16 as an etching mask, the transparent substrate 420 is etched using an etchant, such as hydrofluoric acid, to define the pattern of the transparent substrate 420. Afterwards, the photoresist layer 16 is removed from the transparent substrate 420.

Alternatively, the transparent substrate 420 can be previously cut into multiple pieces with a predetermined size and then the separated pieces are joined with the ring-shaped protrusions 416.

Figure 3F:
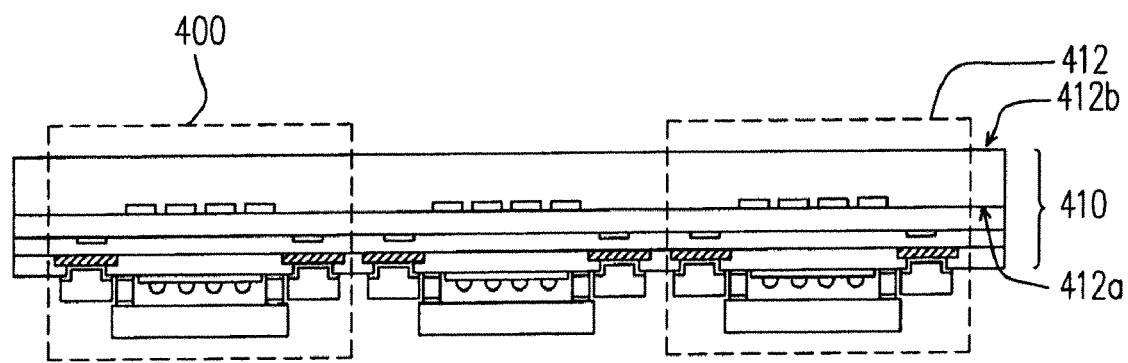

FIG. 3F is a schematically cross-sectional view showing a process of fabricating a chip package according to the first embodiment of this invention. Referring to FIGS. 2A, 2B and 3F, in step S350, the semiconductor wafer 410 is segmented into multiple individual semiconductor chip packages 400 using a cutting tool (not shown).

Figure 3G:
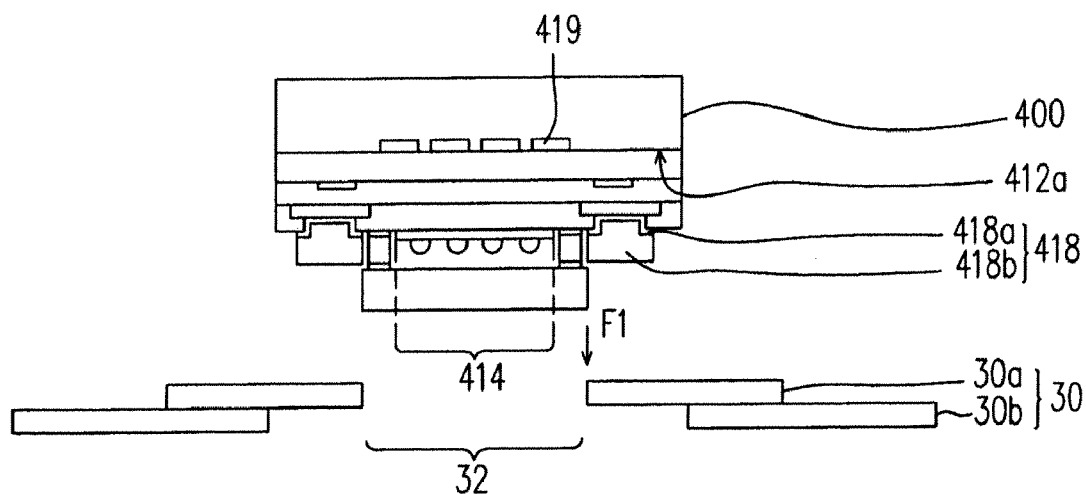

FIG. 3G is a schematically cross-sectional view showing a process of fabricating a chip package according to the first embodiment of this invention. Referring to FIGS. 2A, 2B and 3G, in step S360, the bumps 418 of the individual semiconductor chip package 400 are bonded to a flexible tape 30 in an F1 direction. The flexible tape 30 comprises metal traces 30a and a polymer layer 30b, wherein the metal traces 30a is formed on the polymer layer 30b. An opening 32 through the flexible tape 30 exposes the photo-sensitive area 414 of the semiconductor chip package 400. Thus, light can pass through the opening 32 and can be sensed by the photo-sensitive area 414 of the semiconductor chip package 400. A signal can be transmitted between the semiconductor devices 419 of the semiconductor chip package 400 and an external circuitry, such as printed circuit board, through the flexible tape 30.

Figure 3H:
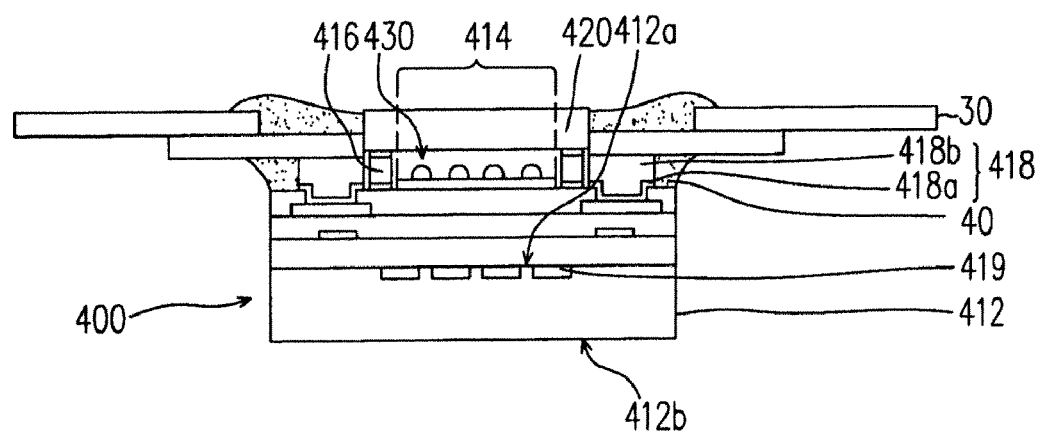

FIG. 3H is a schematically cross-sectional view showing a process of a chip package process according to the first embodiment of this invention. Referring to FIGS. 2A, 2B and 3H, in step S370, an underfill 40, such as polymer, is provided to cover the bumps 418 and the metal traces 30a of the flexible circuit substrate 30.

Referring to FIGS. 2A, 2B and 3C, it is worthy to notice that, the steps prior to above-mentioned step S330, that is, the steps for constructing the airtight space 430 enclosed by the semiconductor chip 412, transparent substrate 420 and ring-shaped protrusion 416 can be carried out in a high class clean room in a wafer fab. This can efficiently reduce particles existing in the airtight space 430 and increase the sensitivity of the photo-sensitive area 414. Therefore, the yield rate of fabricating the semiconductor chip package 400 can be improved. As to the step after the above-mentioned step S340, that is, the step of patterning the transparent substrate 420, cutting the semiconductor wafer 410 and bonding the tape 30 to the bumps 418 can be carried out in a low class clean room in a packaging fab.

In the steps S300a and S300b for fabricating the semiconductor chip packages, the semiconductor wafer 410 and transparent substrate 420 are first joined and the transparent substrate 420 is then patterned using photolithography and etching processes, whereby the duration of manufacturing the semiconductor chip package 400 can be efficiently retrenched.

Second Embodiment

Figure 4A:
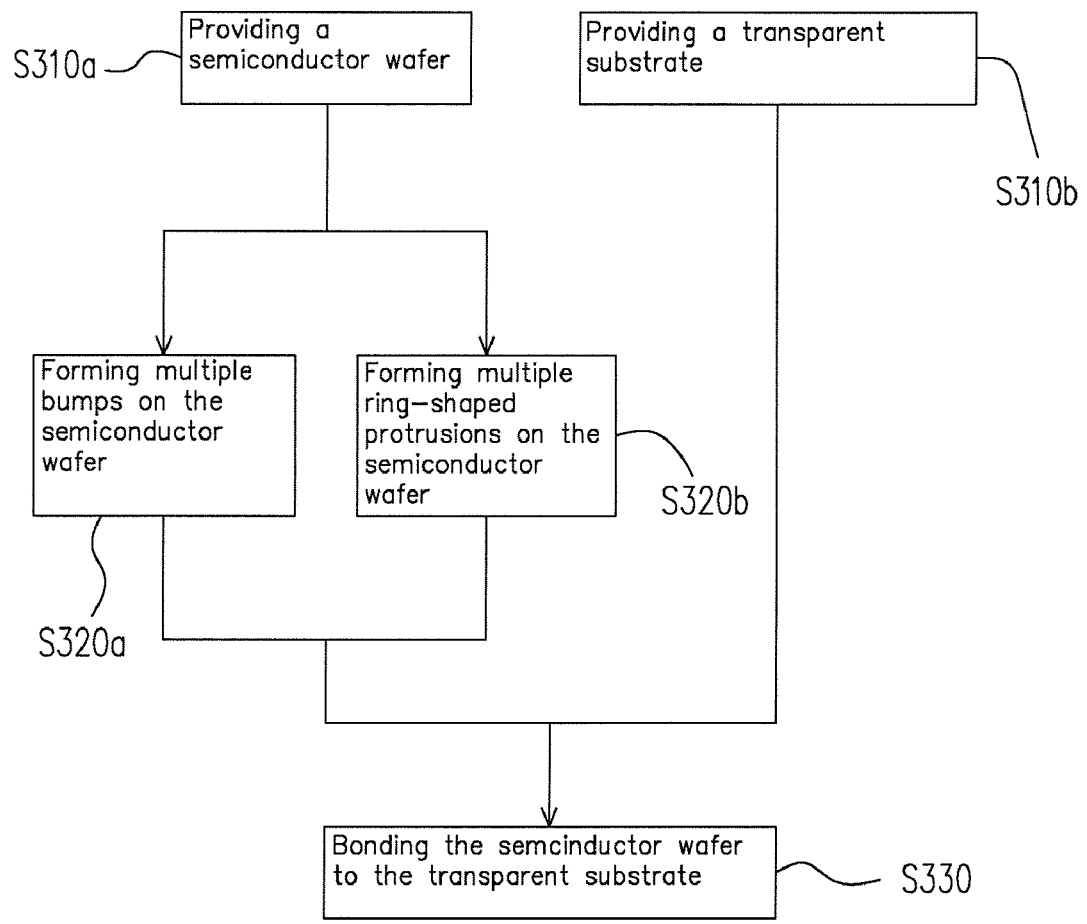
FIG. 4A is a flowchart of fabricating a semiconductor chip package according to the second embodiment of this invention.
Figure 5A:
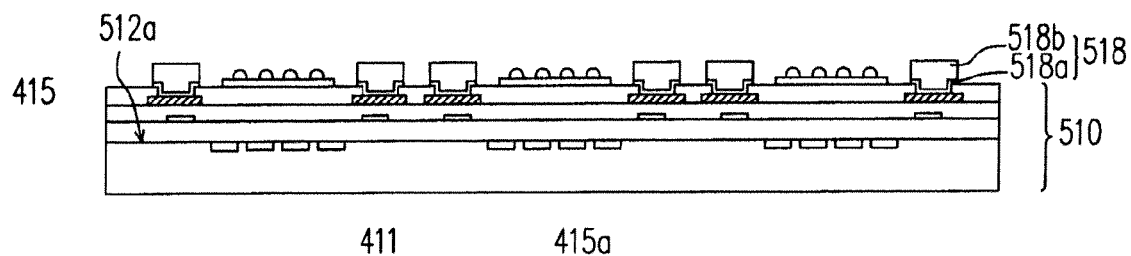
FIGS. 5A and 5B are schematically cross-sectional views showing a process for fabricating a semiconductor chip package according to the second embodiment of this invention.

FIG. 4A is a flowchart of fabricating a semiconductor chip according to the second embodiment of this invention. FIG. 5A is a schematically cross-sectional view showing a process of fabricating a semiconductor chip according to the second embodiment of this invention. Referring to FIGS. 4A and 5A, the process S301 of forming a semiconductor chip package comprises the following steps. First, in step S310a, a semiconductor wafer 510 is provided and has a similar structure to the above-mentioned semiconductor wafer 410 in the first embodiment. Then, in step S320a, multiple bumps 518 are formed over the active surface 512a of the semiconductor wafer 510. Each of the bumps 518 comprises an adhesion/barrier layer 518a and a gold layer 518b, wherein the gold layer 518b is on the adhesion/barrier layer 518a. The material of the adhesion/barrier layer 518a is, for example, a Ti/W alloy, titanium, titanium nitride or tantalum nitride, etc. The gold layer 518b may have a thickness of between 10 and 50 microns, for example.

The bumps 518 can be formed by first sputtering an adhesion/barrier layer, such as titanium, a titanium-tungsten alloy, chromium, titanium-nitride, tantalum, tantalum-nitride, with a thickness of between 100 and 5000 angstroms, for example, on the passivation layer 415 and the bonding pad 411 exposed by the opening 415a in the passivation layer 415, then sputtering, electroless plating or electroplating a seed layer, such as gold or copper, with a thickness of between 1000 angstroms and 2 microns, for example, on the adhesion/barrier layer, next forming a photoresist layer on the seed layer, multiple openings in the photoresist layer exposing the seed layer, then electroplating a bulk metal layer on the seed layer exposed by the openings in the photoresist layer, then removing the photoresist layer, then etching the seed layer not under the bulk metal layer, and then etching the adhesion/barrier layer not under the bulk metal layer. The bulk metal layer may contain more than 95 weight percent of gold and may have a thickness of between 1 and 50 microns; in this case, the seed layer is preferably gold. Alternatively, the bulk metal layer may be formed by first electroplating a copper layer on the seed layer exposed by the openings in the photoresist layer, next electroplating a nickel layer on the copper layer in the openings in the photoresist layer, and then electroplating a solder layer on the nickel layer in the openings in the photoresist layer. The copper layer contains more than 95 weight percent of copper and has a thickness of between 1 and 100 microns, and preferably between 50 and 100 microns; in this case, the seed layer is preferably copper. The nickel layer contains more than 95 weight percent of nickel and has a thickness of between 1 and 100 microns, and preferably between 1 and 10 microns. The solder layer contains a tin-lead alloy, a tin-silver alloy or a tin-silver-copper alloy, and has a thickness of between 1 and 300 microns, and preferably between 10 and 50 microns.

Figure 5B:
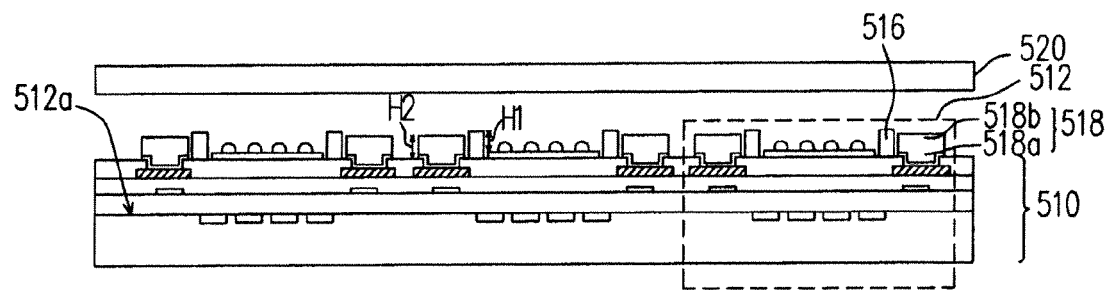
Figure 5B:
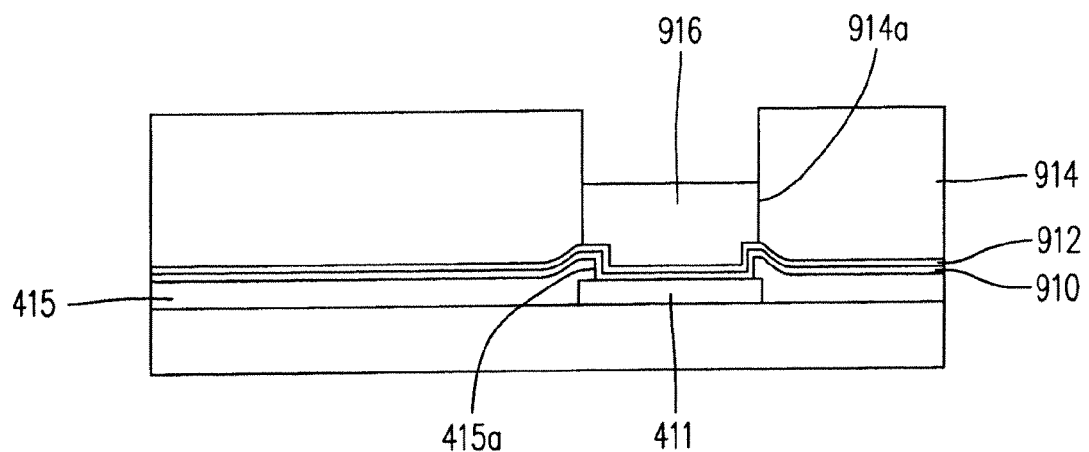
Figure 5B:
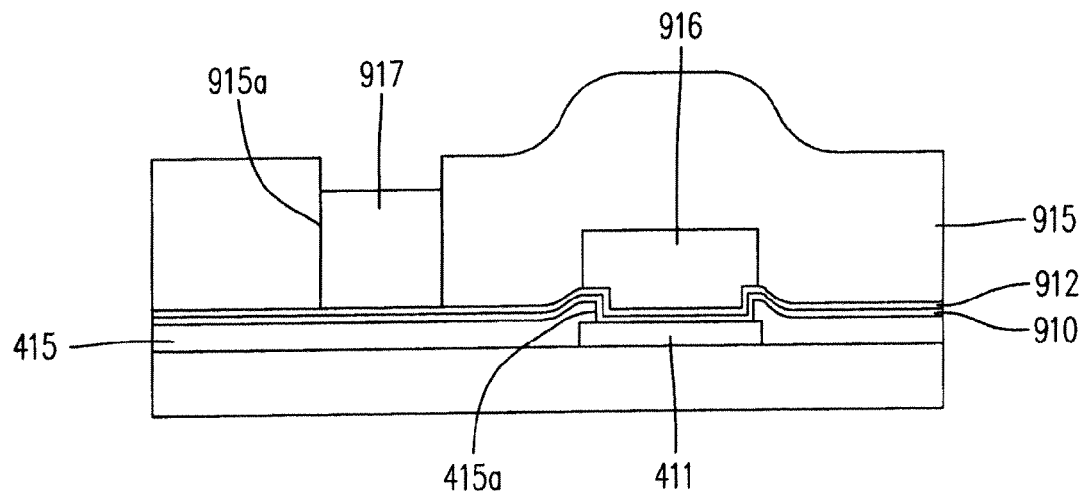
Figure 5B:
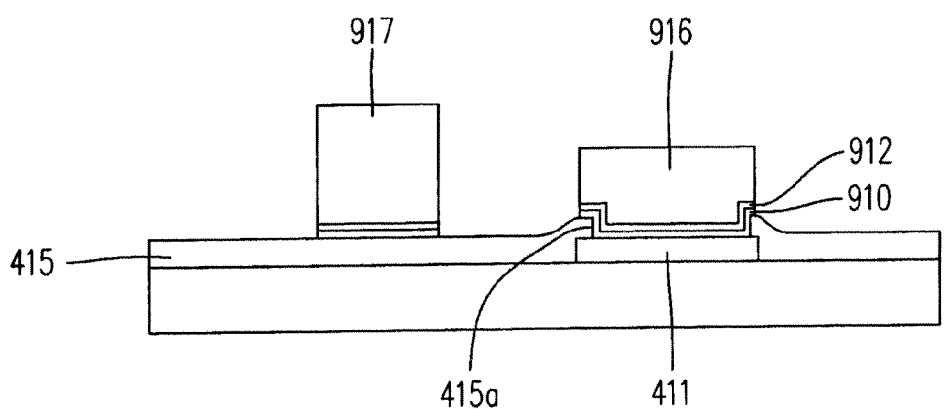
Figure 5B:
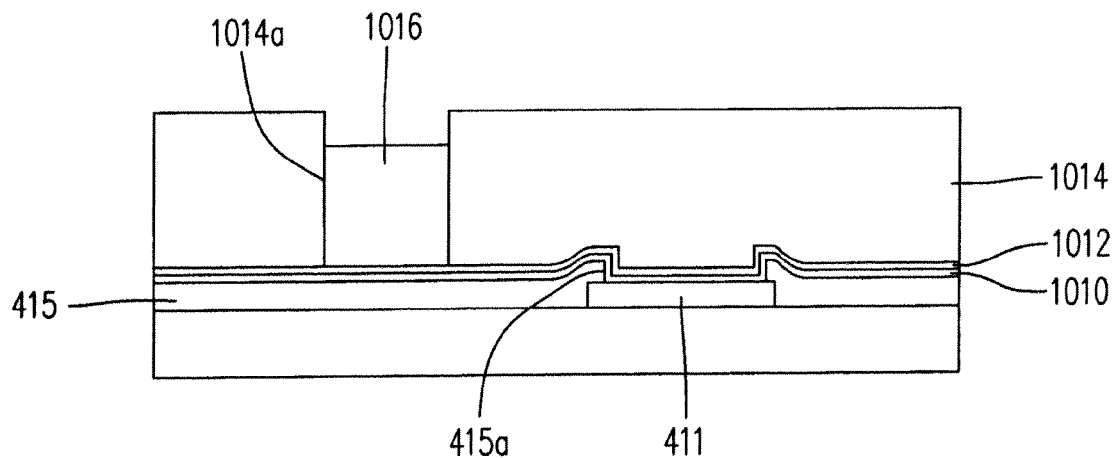
Figure 5B:
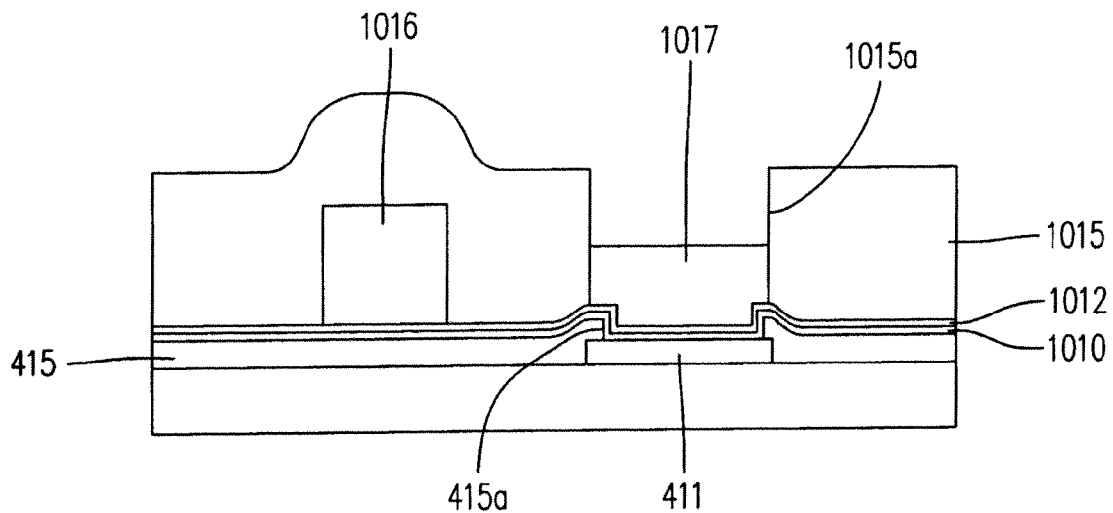
Figure 5B:
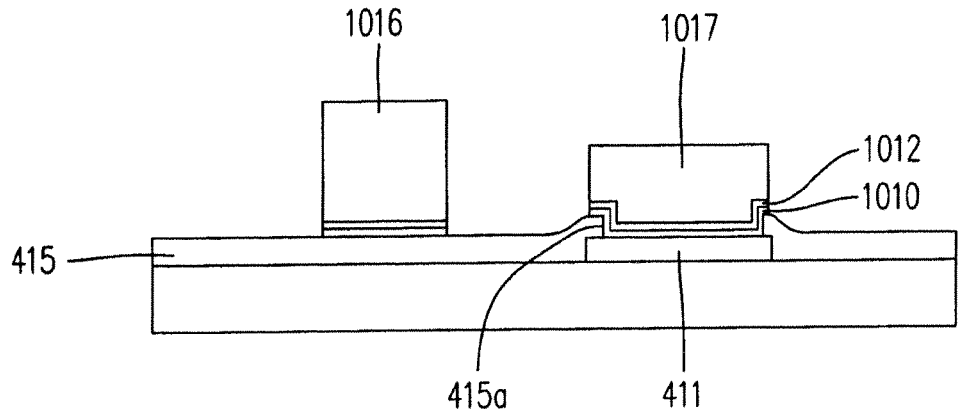

FIG. 5B is a schematically cross-sectional view showing a process for fabricating a semiconductor chip according to the second embodiment of this invention. Referring to FIGS. 4A and 5B, in step S320b, after forming the bumps 518, multiple ring-shaped protrusions 516 are formed over the active surface 512a of the wafer 510, wherein the height H1 of the ring-shaped protrusion 516 is higher than the height H2 of the bumps 518. The principal material of the ring-shaped protrusion 516 is, for example, an adhesive polymer, epoxy resin, polyimide, benzocyclobutene (BCB), or the material used for a solder mask layer of a printed circuit board. Alternatively, the step S320b can be followed by the step 320a. After forming the bumps 518 and ring-shaped protrusion 516, in step S310b, the transparent substrate 520 is provided and in step S330, the ring-shaped protrusion 516 on the semiconductor wafer 510 is joined with the transparent substrate 520. The transparent substrate 520 may be made of silicon oxide, glass or transparent plastic sheet, for example. The bumps 518 may have a thickness of between 5 and 50 microns; the ring-shaped protrusion 516 may have a thickness of between 10 and 500 microns. After forming the bumps 518 and ring-shaped protrusion 516 on the semiconductor wafer 510, the semiconductor wafer 510 and the transparent substrate 520 can be joined with the ring-shaped protrusion 516 bonded to the transparent substrate 520. As to the rest steps, they can refer to the above-mentioned process S300a of fabricating the semiconductor chip package.

Alternatively, the bumps 518 and ring-shaped protrusion 516 can be formed using other ways, as shown in FIGS. 5BA through 5BC. The bumps 518 and ring-shaped protrusion 516 can be formed by first, referring to FIG. 5BA, sputtering an adhesion/barrier layer 910, such as titanium, titanium-tungsten alloy, tantalum nitride, tantalum, titanium nitride, chromium, on the passivation layer 415 and the bonding pads 411 exposed by the openings 415a in the passivation layer 415, then sputtering, electroless plating or electroplating a seed layer 912, such as copper, gold, silver, palladium or platinum, on the adhesion/barrier layer 910, next forming a photoresist layer 914 on the seed layer 912, multiple openings 914a for the bumps 518 in the photoresist layer 914 exposing the seed layer 912, then electroplating a bulk metal layer 916 for the bumps 518 on the seed layer 912 exposed by the openings 914a in the photoresist layer 914, then removing the photoresist layer 914, next, referring to FIG. 5BB, forming another photoresist layer 915 on the seed layer 912 and on the bulk metal layer 916, multiple ring-shaped openings 915a in the photoresist layer 915 exposing the seed layer 912, then electroplating a bulk metal layer 917 for the ring-shaped protrusions 516 on the seed layer 912 exposed by the openings 915a in the photoresist layer 915, then removing the photoresist layer 915, and then removing the seed layer 912 not under the bulk metal layers 916 and 917 respectively for the bumps 518 and for the ring-shaped protrusions 516, next removing the adhesion/barrier layer 910 not under the bulk metal layers 916 and 917 respectively for the bumps 518 and for the ring-shaped protrusions 516, as shown in FIG. 5BC.

The bulk metal layer 916 may have a thickness different from that of the bulk metal layer 917. Preferably, the bulk metal layer 917 for the ring-shaped protrusions 516 is higher than the bulk metal layer 916 for the bumps 518.

As to a first case, both or either of the bulk metal layers 916 and/or 917 may contain more than 95 weight percent of gold and may have a thickness of between 1 and 50 microns, and preferably between 5 and 30 microns. As to a second case, both or either of the bulk metal layers 916 and/or 917 may be formed by first electroplating a copper layer on the seed layer 912 exposed by the openings 914a and/or 915a in the photoresist layer 914 and/or 915, next electroplating a nickel layer on the copper layer in the openings 914a and/or 915a in the photoresist layer 914 and/or 915, and then electroplating a solder layer on the nickel layer in the openings 914a and/or 915a in the photoresist layer 914 and/or 915. The copper layer contains more than 95 weight percent of copper and has a thickness of between 5 and 100 microns, and preferably between 5 and 50 microns. The nickel layer contains more than 95 weight percent of nickel and has a thickness of between 1 and 100 microns, and preferably between 1 and 10 microns. The solder layer contains a tin-lead alloy, a tin-silver alloy or a tin-silver-copper alloy, and has a thickness of between 1 and 300 microns, and preferably between 10 and 50 microns. Alternatively, the copper layer can be substituted with electroplated gold layer containing more than 95 weight percent of gold and having a thickness of between 5 and 100 microns, and preferably between 5 and 50 microns. Alternatively, the copper layer can be substituted with electroplated silver layer containing more than 95 weight percent of silver and having a thickness of between 5 and 100 microns, and preferably between 5 and 50 microns. Alternatively, the copper layer can be substituted with electroplated platinum layer containing more than 95 weight percent of platinum and having a thickness of between 5 and 100 microns, and preferably between 5 and 50 microns. Alternatively, the copper layer can be substituted with electroplated palladium layer containing more than 95 weight percent of palladium and having a thickness of between 5 and 100 microns, and preferably between 5 and 50 microns.

Both of the bumps 518 and ring-shaped protrusion 516 can be formed following the first case; alternatively, both of the bumps 518 and ring-shaped protrusion 516 can be formed following the second case; alternatively, the bumps 518 can be formed following the first case, but the ring-shaped protrusion 516 can be formed following the second case; alternatively, the bumps 518 can be formed following the second case, but the ring-shaped protrusion 516 can be formed following the first case. Using a heating process, the ring-shaped protrusion 516 formed following the first case can be bonded to a ring-shaped solder paste or an adhesive polymer, such as epoxy, (not shown) previously screen printed on the transparent substrate 520, as shown in FIG. 5B. Using a heating process, the ring-shaped protrusion 516 formed following the second case can be bonded to a ring-shaped pad (not shown), such as gold or copper, previously sputtered on the transparent substrate 520 or bonded to a ring-shaped solder paste or lump (not shown) previously screen printed or electroplated on the transparent substrate 520, as shown in FIG. 5B.

Alternatively, the bumps 518 and ring-shaped protrusion 516 can be formed using other ways, as shown in FIGS. 5BD through 5BF. The bumps 518 and ring-shaped protrusion 516 can be formed by first, referring to FIG. 5BD, sputtering an adhesion/barrier layer 1010, such as titanium, titanium-tungsten alloy, tantalum nitride, tantalum, titanium nitride, chromium, on the passivation layer 415 and the bonding pads 411 exposed by the openings 415a in the passivation layer 415, then sputtering, electroless plating or electroplating a seed layer 1012, such as copper, gold, silver, palladium or platinum, on the adhesion/barrier layer 1010, next forming a photoresist layer 1014 on the seed layer 1012, multiple openings 1014a for the ring-shaped protrusions 516 in the photoresist layer 1014 exposing the seed layer 1012, then electroplating a bulk metal layer 1016 for the ring-shaped protrusions 516 on the seed layer 1012 exposed by the openings 1014a in the photoresist layer 1014, then removing the photoresist layer 1014, next, referring to FIG. 5BE, forming another photoresist layer 1015 on the seed layer 1012 and on the bulk metal layer 1016, multiple ring-shaped openings 1015a in the photoresist layer 1015 exposing the seed layer 1012, then electroplating a bulk metal layer 1017 for the bumps 518 on the seed layer 1012 exposed by the openings 1015a in the photoresist layer 1015, then removing the photoresist layer 1015, and then removing the seed layer 1012 not under the bulk metal layers 1016 and 1017 respectively for the ring-shaped protrusions 516 and for the bumps 518, next removing the adhesion/barrier layer 1010 not under the bulk metal layers 1016 and 1017 respectively for the ring-shaped protrusions 516 and for the bumps 518, as shown in FIG. 5BF.

The bulk metal layer 1016 may have a thickness different from that of the bulk metal layer 1017. Preferably, the bulk metal layer 1016 for the ring-shaped protrusions 516 is higher than the bulk metal layer 1017 for the bumps 518.

As to a first case, both or either of the bulk metal layers 1016 and/or 1017 may contain more than 95 weight percent of gold and may have a thickness of between 1 and 50 microns, and preferably between 5 and 30 microns. As to a second case, both or either of the bulk metal layers 1016 and/or 1017 may be formed by first electroplating a copper layer on the seed layer 1012 exposed by the openings 1014a and/or 1015a in the photoresist layer 1014 and/or 1015, next electroplating a nickel layer on the copper layer in the openings 1014a and/or 1015a in the photoresist layer 1014 and/or 1015, and then electroplating a solder layer on the nickel layer in the openings 1014a and/or 1015a in the photoresist layer 1014 and/or 1015. The copper layer contains more than 95 weight percent of copper and has a thickness of between 5 and 100 microns, and preferably between 5 and 50 microns. The nickel layer contains more than 95 weight percent of nickel and has a thickness of between 1 and 100 microns, and preferably between 1 and 10 microns. The solder layer contains a tin-lead alloy, a tin-silver alloy or a tin-silver-copper alloy, and has a thickness of between 1 and 300 microns, and preferably between 10 and 50 microns. Alternatively, the copper layer can be substituted with electroplated gold layer containing more than 95 weight percent of gold and having a thickness of between 5 and 100 microns, and preferably between 5 and 50 microns. Alternatively, the copper layer can be substituted with electroplated silver layer containing more than 95 weight percent of silver and having a thickness of between 5 and 100 microns, and preferably between 5 and 50 microns. Alternatively, the copper layer can be substituted with electroplated platinum layer containing more than 95 weight percent of platinum and having a thickness of between 5 and 100 microns, and preferably between 5 and 50 microns. Alternatively, the copper layer can be substituted with electroplated palladium layer containing more than 95 weight percent of palladium and having a thickness of between 5 and 100 microns, and preferably between 5 and 50 microns.

Both of the bumps 518 and ring-shaped protrusion 516 can be formed following the first case; alternatively, both of the bumps 518 and ring-shaped protrusion 516 can be formed following the second case; alternatively, the bumps 518 can be formed following the first case, but the ring-shaped protrusion 516 can be formed following the second case; alternatively, the bumps 518 can be formed following the second case, but the ring-shaped protrusion 516 can be formed following the first case. Using a heating process, the ring-shaped protrusion 516 formed following the first case can be bonded to a ring-shaped solder paste or an adhesive polymer, such as epoxy, (not shown) previously screen printed on the transparent substrate 520, as shown in FIG. 5B. Using a reflow process, the ring-shaped protrusion 516 formed following the second case can be bonded to a ring-shaped pad (not shown), such as gold or copper, previously sputtered on the transparent substrate 520 or bonded to a ring-shaped solder paste or lump (not shown) previously screen printed or electroplated on the transparent substrate 520, as shown in FIG. 5B.

Third Embodiment

Figure 4B:
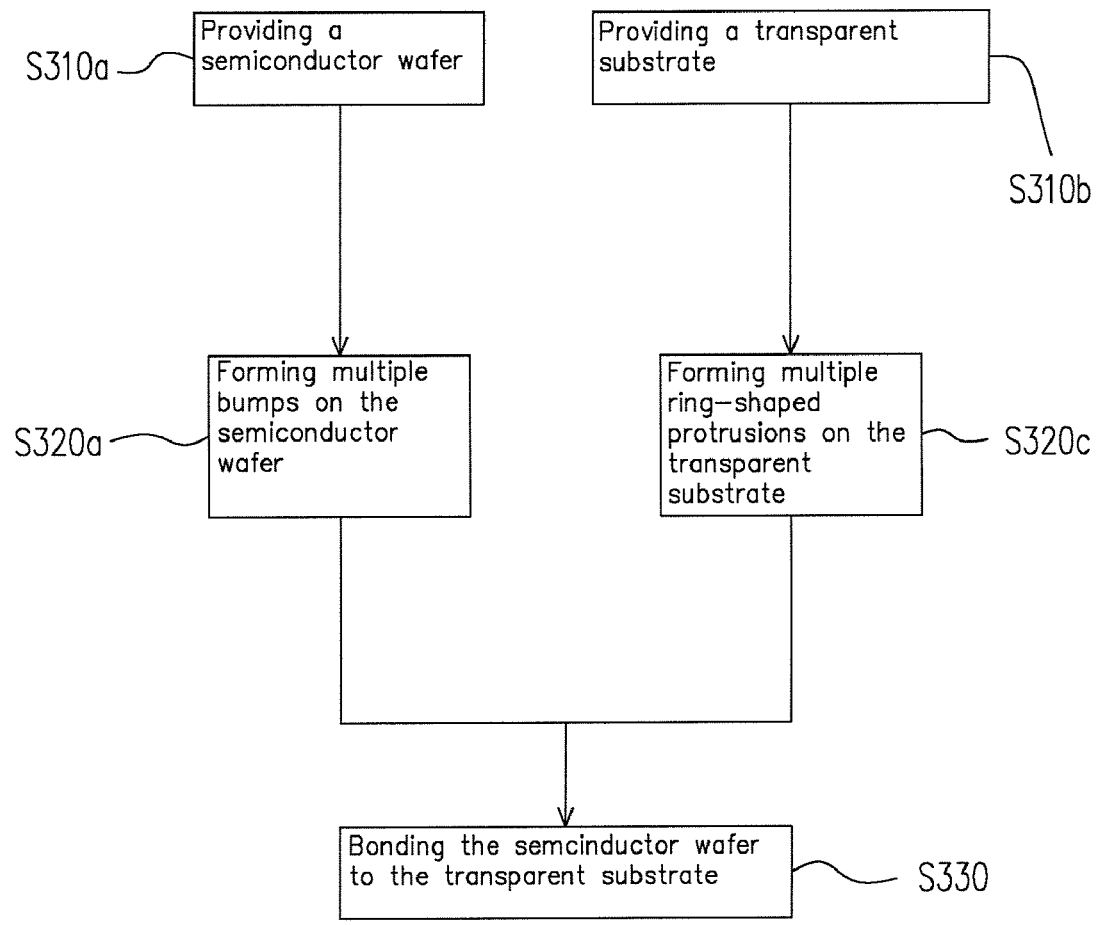
FIG. 4B is another flowchart of fabricating a semiconductor chip package according to the third embodiment of this invention.
Figure 6A:
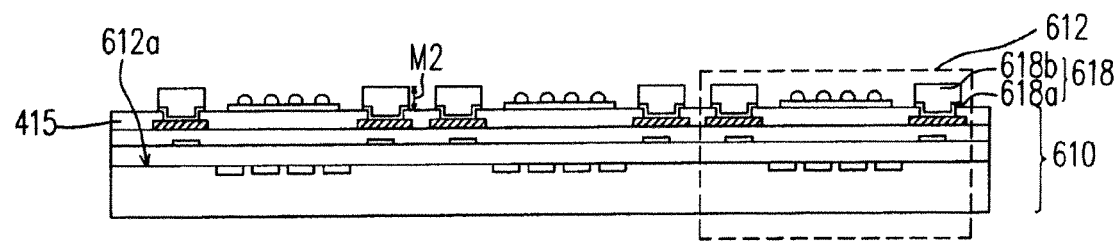
FIGS. 6A and 6B are schematically cross-sectional views showing a process for fabricating a semiconductor chip package according to the third embodiment of this invention.
Figure 6B:
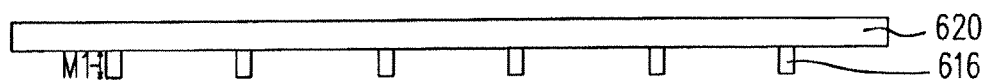
Figure 6B:
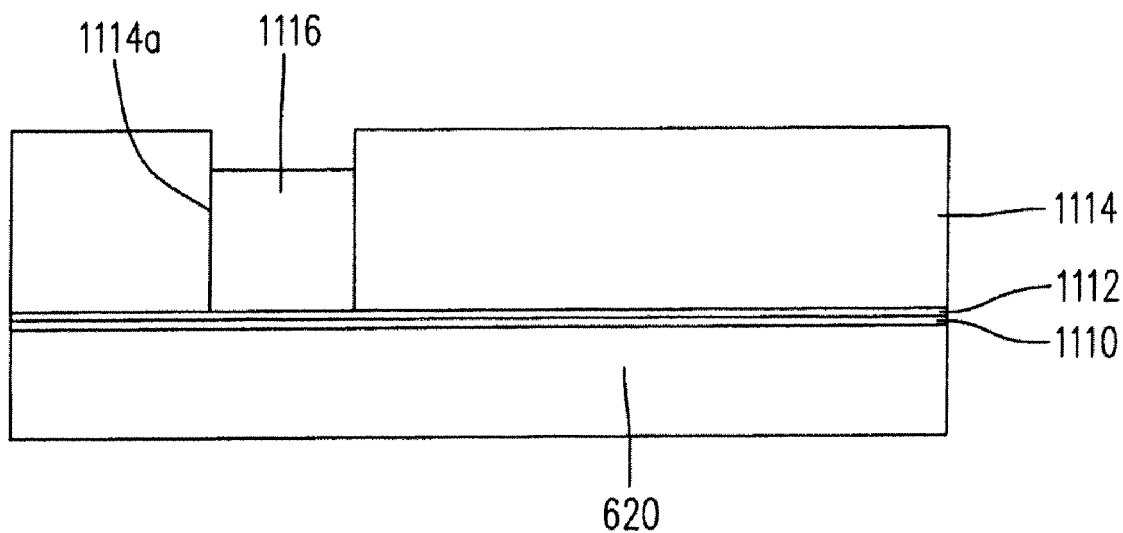
Figure 6B:
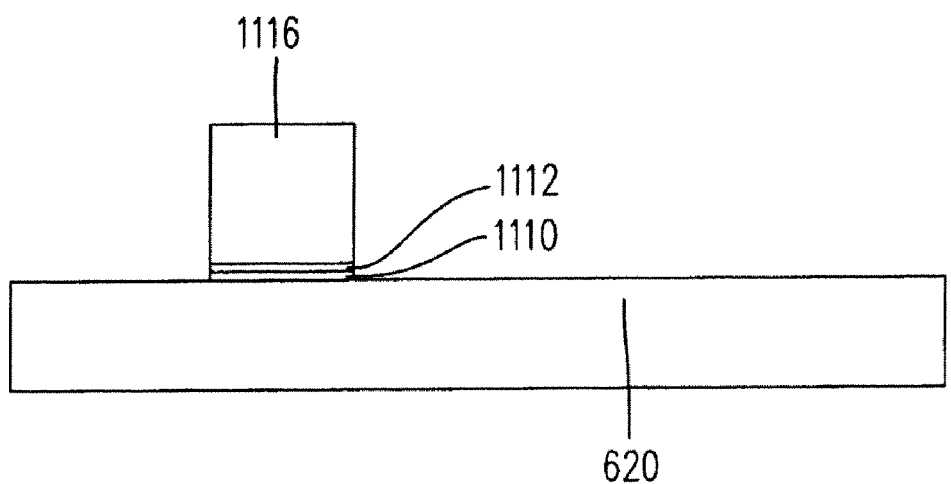

FIG. 4B is a flowchart S302 of fabricating a semiconductor chip package according to the third embodiment of this invention. FIGS. 6A and 6B are schematically cross-sectional views showing a process for fabricating a semiconductor chip package according to the third embodiment of this invention. Referring to FIG. 4B and 6A, in step S320a, multiple bumps 618 are formed over the active surface 612a of the semiconductor wafer 610. The detail of the bumps 618 can refer to the bumps 418 or 518 described in the first or second embodiment of this invention. Referring to FIGS. 4B, 6A and 6B, in step S320c, multiple protrusions 616 are formed on a bottom surface of the transparent substrate 620, wherein the protrusions 616 are ring shaped (from a bottom view), for example. The height M1 of the ring-shaped protrusions 616 is higher than the height M2 of the bumps 618. The transparent substrate 620 may be made of silicon oxide, glass or transparent plastic sheet, for example. The ring-shaped protrusion 616 is, for example, an adhesive polymer, epoxy resin, polyimide, benzocyclobutene (BCB), or a material used as a solder mask layer of a printed circuit board and can be formed by screen printing.

FIGS. 6BA-6BB are schematically cross-sectional views showing a process for forming ring-shaped protrusions on a transparent substrate according to the third embodiment. The transparent substrate 620 may be silicon oxide, transparent polymer material or glass. Alternatively, the ring-shaped protrusion 616 can be formed by, referring to FIG. 6BA, sputtering an adhesion/barrier layer 1110, such as a titanium-tungsten alloy, titanium, titanium nitride, tantalum nitride, or tantalum, on the transparent substrate 620, then sputtering, electroless plating or electroplating a seed layer 1112, such as gold or copper, on the adhesion/barrier layer 1110, next forming a photoresist layer 1114 on the seed layer 1112, multiple ring-shaped openings 1114a in the photoresist layer 1114 exposing the seed layer 1112, then electroplating a bulk metal layer 1116 with a thickness of between 10-200 microns on the seed layer 1112 exposed by the ring-shaped openings 1114a in the photoresist layer 1114, then, referring to FIG. 6BB, removing the photoresist layer 1114, next removing the seed layer 1112 not under the bulk metal layer 1116, and next removing the adhesion/barrier layer 1110 not under the bulk metal layer 1116.

As to a first case, the bulk metal layer 1116 may contain more than 95 weight percent of gold and may have a thickness of between 1 and 50 microns. Using a reflow process, the ring-shaped protrusion 616 formed following the first case can be bonded to a ring-shaped solder paste or an adhesive polymer, such as epoxy, previously screen printed on the passivation layer 415. As to a second case, the bulk metal layer 1116 may be formed by first electroplating a copper layer on the seed layer 1112 exposed by the openings 1114a in the photoresist layer 1114, next electroplating a nickel layer on the copper layer in the opening 1114a in the photoresist layer 1114, and then electroplating a solder layer on the nickel layer in the opening 1114a in the photoresist layer 1114. The copper layer contains more than 95 weight percent of copper and has a thickness of between 1 and 100 microns, and preferably between 50 and 100 microns. The nickel layer contains more than 95 weight percent of nickel and has a thickness of between 1 and 100 microns, and preferably between 1 and 10 microns. The solder layer contains a tin-lead alloy, a tin-silver alloy or a tin-silver-copper alloy, and has a thickness of between 1 and 300 microns, and preferably between 10 and 50 microns. Using a reflow process, the ring-shaped protrusion 616 formed following the second case can be bonded to a ring-shaped pad (not shown), such as gold or copper, previously sputtered on the passivation layer 415 or bonded to a ring-shaped solder paste or lump (not shown) previously screen printed or electroplated on the passivation layer 415.

After forming the bumps 618 on the semiconductor wafer 610 and forming the ring-shaped protrusion 616 on the transparent substrate 620, the semiconductor wafer 610 and the transparent substrate 620 can be joined with the ring-shaped protrusion 616 bonded to the semiconductor wafer 610 using a reflow process. As to the rest steps, they can refer to the above-mentioned process S300a of fabricating the semiconductor chip package.

Alternatively, the ring-shaped protrusion 616, such plastic, rubber, copper, aluminum or gold, can be preformed. The preformed ring-shaped protrusion 616 can be bonded to the transparent substrate 620 using a first adhesive material, such as epoxy. When the transparent substrate 620 is bonded to the semiconductor wafer 610, the bottom surface of the ring-shaped protrusion 616 can be dipped in a second adhesive material (not shown), such as epoxy or solder paste, to have the second adhesive material formed thereon. Using a heating process, the second adhesive material bond the ring-shaped protrusion 616 to the passivation layer 415 or to a metal pad (not shown) previously formed on the passivation layer 415.

Alternatively, before the preformed ring-shaped protrusion 616 is bonded to the transparent substrate 620, an adhesive material, such as solder material or thermoplastic polymer, is formed on the bottom surface of the ring-shaped protrusion 616. Using a heating process, the adhesive material bond the ring-shaped protrusion 616 to the passivation layer 415 or to a metal pad (not shown) previously formed on the passivation layer 415.

Fourth Embodiment

Figure 7:
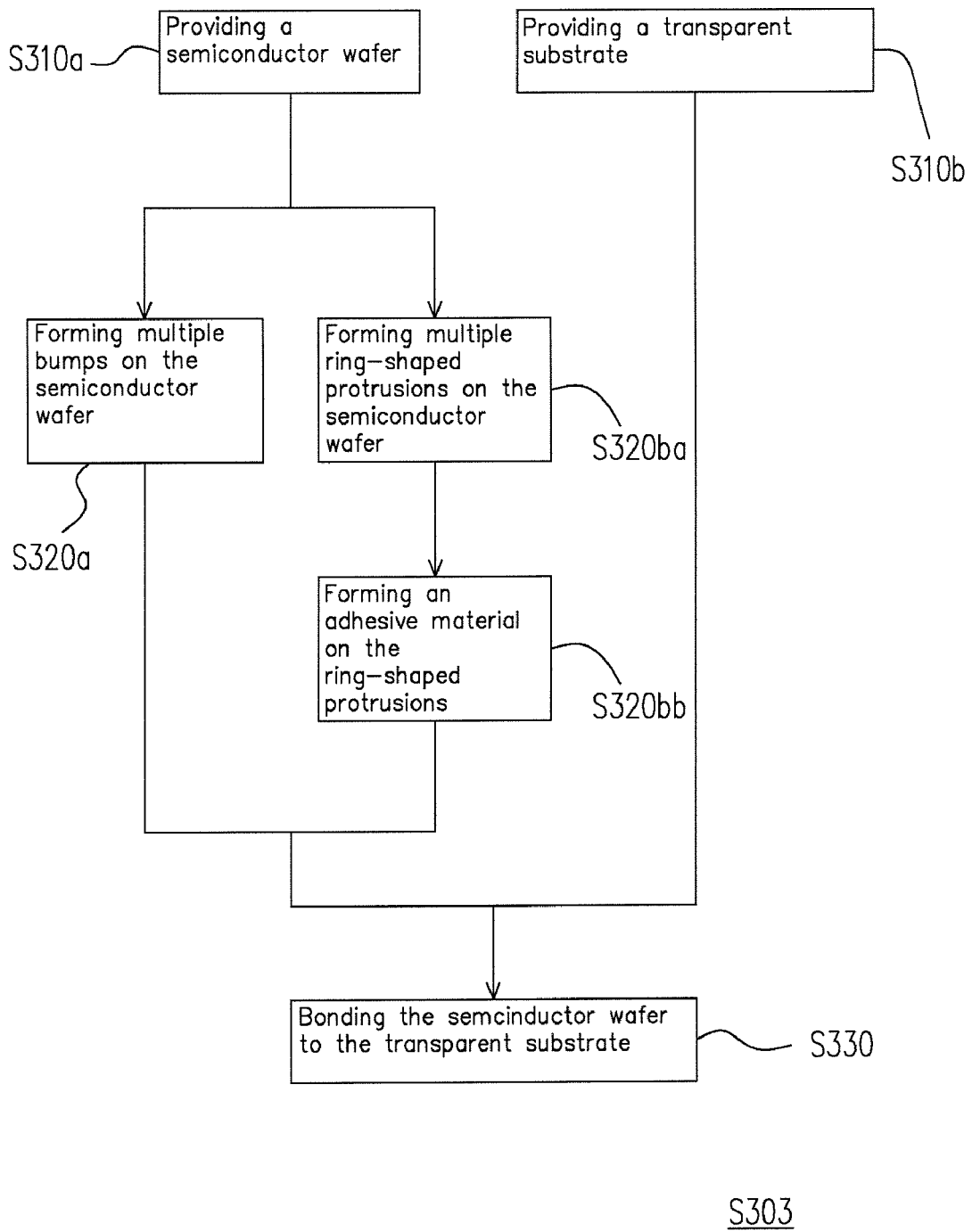
FIG. 7 is a flowchart of fabricating a semiconductor chip package according to the fourth embodiment of this invention.
Figure 8A:
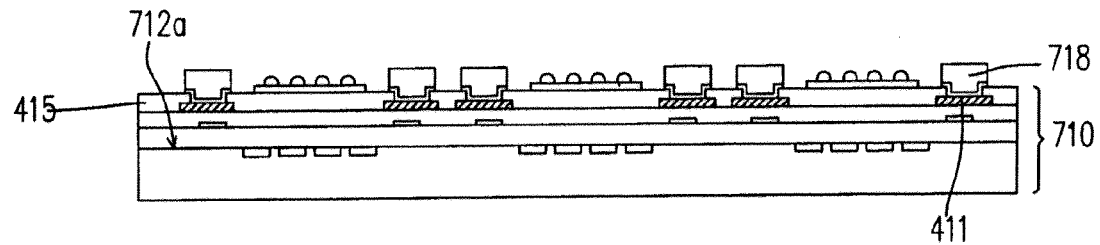
FIGS. 8A-8C are schematically cross-sectional views showing a process of fabricating a semiconductor chip package according to the fourth embodiment of this invention.
Figure 8B:
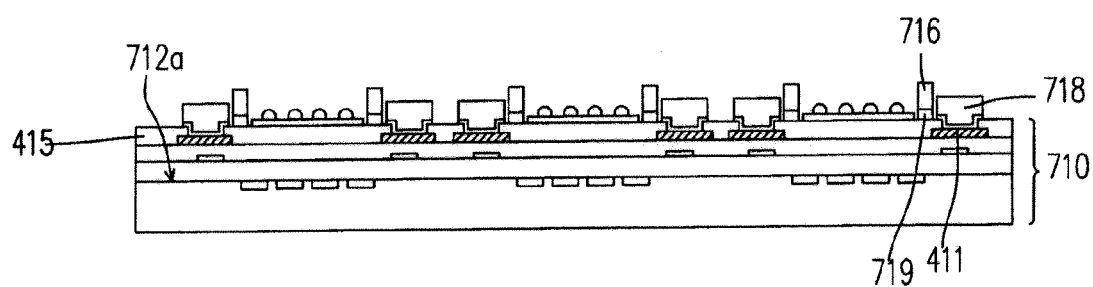
Figure 8C:
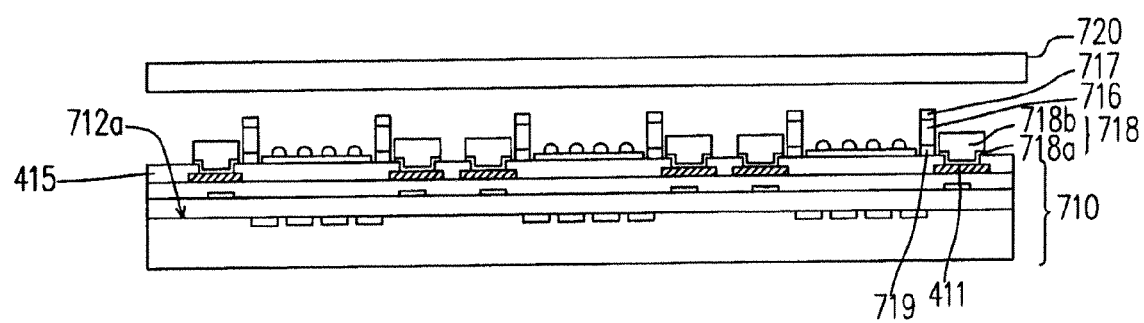

FIG. 7 is a flowchart of fabricating a semiconductor chip package according to the fourth embodiment of this invention. FIGS. 8A-8C are schematically cross-sectional views showing a process of fabricating a semiconductor chip package according to the fourth embodiment of this invention. Referring to FIGS. 7 and 8A, the method S303 of fabricating a semiconductor chip package comprises several steps as follows. First, in step S310a, a semiconductor wafer 710 is provided and can be referred to as the semiconductor wafer 410 mentioned in the first embodiment. Next, in step S320a, multiple bumps 718 are formed over the active surface 712a of the semiconductor wafer 710.

Referring to FIG. 8B, in step S320ba, multiple non-adhesive ring-shaped protrusions 716, such as polymer, plastic, rubber, glass or metal, are preformed. After forming the bumps 718 on the bonding pads 411 exposed by the openings 411 in the passivation layer 415, as shown in FIG. 8A, the preformed ring-shaped protrusions 716 can be attached to the passivation layer 415 of the wafer 710 using an adhesive material 719 with a ring-shaped pattern, such as epoxy, polyimide or benzocyclobuteme (BCB), as shown in FIG. 8B. Preferably, the height of the preformed ring-shaped protrusions 716 plus the adhesive material 719 is greater than the height of the bumps 718. Thereafter, the top surface of the ring-shaped protrusions 716 may be dipped in an adhesive material 717, such as epoxy polyimide, benzocyclobuteme (BCB) or solder paste, to have the adhesive material 717 with a ring-shaped pattern formed on the top surface of the ring-shaped protrusions 716, as shown in FIG. 8C. Next, the ring-shaped protrusions 716 can be joined with the transparent substrate 720, such as silicon oxide, glass or transparent plastic sheet, using the adhesive material 713. Alternatively, the steps S320ba and S320bb can be followed by the step 320a. Alternatively, the step S320ba can be followed by the step 320a followed by the step S320bb.

In another case, the adhesive material 717, such as thermoplastic polymer material or solder material, can be previously formed on the top surface of the ring-shaped protrusions 716, and then the bottom surface of the ring-shaped protrusions 716 is attached to the passivation layer 415 of the semiconductor wafer using the adhesive material 719. Therefore, the step S320bb can be followed by the step S320ba. In combination with the step S320a for forming the bumps, the step S320a can be followed by the step S320bb followed by the step S320ba; alternatively, the step S320a can be performed after the step S320ba following the step S320bb is performed.

CONCLUSION

The steps for constructing the airtight space enclosed by a semiconductor chip, transparent substrate and ring-shaped protrusion can be carried out in a high class clean room in a wafer fab. This can efficiently reduce particles existing in the airtight space and increase the sensitivity of the photo-sensitive area. Therefore, the yield rate of fabricating the semiconductor chip package can be improved. After forming the airtight space, the steps of patterning the transparent substrate, cutting the semiconductor wafer and bonding the tape to the bumps can be carried out in a low class clean room in a packaging fab. Besides, in the above embodiments, the semiconductor wafer and transparent substrate are first joined and the transparent substrate is then patterned using photolithography and etching processes, whereby the duration of manufacturing the semiconductor chip package can be efficiently retrenched.

It will be apparent to those skilled in the art that various modifications and variations can be made to the structure of the present invention without departing from the scope or spirit of the invention. Therefore, the protection area of the present invention depends on the claims attached in the patent application.

What is claimed is:

1. A chip package comprising:
a semiconductor chip;
an optical filter over a photo-sensitive area of said semiconductor chip;
multiple micro-lenses over said photo-sensitive area;
a metal bump on said semiconductor chip, wherein said metal bump comprises a gold layer having a thickness between 1 and 50 micrometers;
a transparent substrate over said photo-sensitive area, over said optical filter and over said multiple micro-lenses; and
a spacer between said semiconductor chip and said transparent substrate, wherein said spacer has a bottom end joined with said semiconductor chip and a top end joined with said transparent substrate.

2. The chip package of claim 1, wherein said spacer comprises a gold layer with more than 95 weight percent of gold.

3. The chip package of claim 1, wherein said spacer comprises a copper layer with more than 95 weight percent of copper.

4. The chip package of claim 1, wherein said spacer comprises a solder layer having a thickness between 1 and 300 micrometers.

5. The chip package of claim 1, wherein said spacer comprises a copper layer having a thickness between 5 and 100 micrometers.

6. The chip package of claim 1, wherein said spacer comprises a polymer.

7. The chip package of claim 1, wherein said spacer comprises glass.

8. The chip package of claim 1, wherein said spacer comprises a polymer layer joined with said semiconductor chip.

9. The chip package of claim 8, wherein said polymer layer comprises epoxy.

10. The chip package of claim 1, wherein said spacer comprises a polymer layer joined with said transparent substrate.

11. The chip package of claim 10, wherein said polymer layer comprises epoxy.

12. The chip package of claim 1 further comprising a flexible tape joined with said metal bump.

13. The chip package of claim 1, wherein said metal bump further comprises a titanium-containing layer between said gold layer and said semiconductor chip.

14. The chip package of claim 13, wherein said titanium-containing layer comprises a titanium-tungsten alloy.

15. The chip package of claim 1, wherein said spacer has a height greater than that of said metal bump.

16. The chip package of claim 1, wherein said spacer has four sides surrounding said photo-sensitive area.

17. A chip package comprising:
a semiconductor chip;
an optical filter over a photo-sensitive area of said semiconductor chip;
multiple micro-lenses over said photo-sensitive area;
a transparent substrate over said photo-sensitive area, over said optical filter and over said multiple micro-lenses; and
a spacer between said semiconductor chip and said transparent substrate, wherein said spacer has a bottom end joined with said semiconductor chip and a top end joined with said transparent substrate, and wherein said spacer comprises a copper layer having a thickness between 5 and 100 micrometers.

18. The chip package of claim 17 further comprising a metal bump on said semiconductor chip, wherein said semiconductor chip comprises a passivation layer and a metal pad having a top surface at a bottom of an opening in said passivation layer, wherein said passivation layer comprises a nitride layer, and wherein said metal bump is on said top surface.

19. The chip package of claim 18, wherein said metal bump comprises a tin-containing layer having a thickness between 1 and 300 micrometers.

20. The chip package of claim 17, wherein said spacer further comprises a tin-containing layer joined with said transparent substrate.

* * * * *